(12) United States Patent
Kim

(10) Patent No.: US 10,642,612 B2
(45) Date of Patent: May 5, 2020

(54) MEMORY DEVICE PERFORMING PARALLEL ARITHMETIC PROCESSING AND MEMORY MODULE INCLUDING THE SAME

(71) Applicant: Samsung Electronics Co., Ltd., Suwon-si (KR)

(72) Inventor: Jin-hyun Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 20 days.

(21) Appl. No.: 16/034,688

(22) Filed: Jul. 13, 2018

(65) Prior Publication Data
US 2019/0146788 A1 May 16, 2019

(30) Foreign Application Priority Data

Nov. 15, 2017 (KR) .......................... 10-2017-0152504

(51) Int. Cl.
*G06F 9/30* (2018.01)
*G06N 3/08* (2006.01)
*G06F 1/10* (2006.01)

(52) U.S. Cl.
CPC ............. *G06F 9/3001* (2013.01); *G06F 1/10* (2013.01); *G06N 3/08* (2013.01)

(58) Field of Classification Search
CPC ............. G06F 1/00–3296; G06F 3/00; G06F 3/06–0689; G06F 5/00–16; G06F 9/00–548; G06F 11/00–3696; G06F 12/00–16; G06F 13/00–4295; G06F 16/00–986; G06F 17/00–5095; G06F 21/00–88; G06F 2003/0691–0698; G06F 2009/3883; G06F 2009/45562–45595; G06F 2201/00–885; G06F 2206/00–20; G06F 2209/00–549; G06F 2211/00–902; G06F 2212/00–7211; G06F 2213/00–4004; G06F 2216/00–17;
(Continued)

(56) References Cited

U.S. PATENT DOCUMENTS 7,246,215 B2 7/2007 Lu et al.
7,296,112 B1 11/2007 Yarlagadda et al.
(Continued)

OTHER PUBLICATIONS

Final Report: Processor-In-Memory (PIM) Based Architectures for PetaFlops Potential Massively Parallel Processing; Kogge, Peter M.; NASA Grant NAG 5-2998; retrieved from https://ntrs.nasa.gov/archive/nasa/casi.ntrs.nasa.gov/19970001424.pdf on Sep. 25, 2019; Jul. 15, 1996 (Year: 1996).*
(Continued)

*Primary Examiner* — Daniel C. Chappell
(74) *Attorney, Agent, or Firm* — Muir Patent Law, PLLC

(57) ABSTRACT

A memory module includes a first memory device configured to receive data and first information from a hardware accelerator, to generate an arithmetic result by performing arithmetic processing using the data and the first information, and to output the arithmetic result through an interface with at least one other memory device; and a second memory device configured to receive the arithmetic result from the first memory device through the interface without using the hardware accelerator, and to store the arithmetic result.

19 Claims, 18 Drawing Sheets

(58) Field of Classification Search
CPC .......... G06F 2221/00–2153; G06N 3/00–126;
G11C 11/00–5692; G11C 13/00–06;
G11C 15/00–06; G11C 16/00–3495;
G11C 17/00–18; G11C 2216/00–30

See application file for complete search history.

(56) References Cited

U.S. PATENT DOCUMENTS

| | | | |
|---|---|---|---|
| 7,861,014 B2 | 12/2010 | Gower et al. | |
| 8,493,808 B2 | 7/2013 | Pyeon | |
| 8,803,552 B2 | 8/2014 | Vorbach | |
| 9,361,973 B2 | 6/2016 | Maheshwari | |
| 9,430,369 B2 | 8/2016 | Doerr et al. | |
| 9,507,745 B1* | 11/2016 | Bratt | G06F 9/5022 |
| 9,697,463 B2 | 7/2017 | Ross et al. | |
| 9,977,609 B2* | 5/2018 | Jayasena | G06F 12/10 |
| 10,416,896 B2* | 9/2019 | O | G06F 13/1673 |
| 2004/0148482 A1 | 7/2004 | Grundy | G06F 12/06 711/167 |
| 2005/0021871 A1* | 1/2005 | Georgiou | G06F 15/7832 709/250 |
| 2013/0227244 A1* | 8/2013 | Jung | G06F 9/5072 711/173 |
| 2014/0208041 A1* | 7/2014 | Hyde | G06F 12/0831 711/146 |
| 2014/0304491 A1* | 10/2014 | Kasahara | G06F 13/28 712/42 |
| 2016/0224465 A1* | 8/2016 | Morad | G06F 9/3877 |
| 2016/0342889 A1 | 11/2016 | Thorson et al. | |
| 2016/0342890 A1 | 11/2016 | Young | |
| 2016/0342891 A1 | 11/2016 | Ross et al. | |
| 2016/0342892 A1 | 11/2016 | Ross | |
| 2016/0342893 A1 | 11/2016 | Ross et al. | |
| 2016/0379115 A1* | 12/2016 | Burger | G06N 3/08 706/25 |
| 2017/0140809 A1 | 5/2017 | Mozak et al. | |
| 2017/0177498 A1* | 6/2017 | Wilkes | G06F 12/1027 |
| 2017/0243321 A1* | 8/2017 | Lee | G06T 1/20 |
| 2017/0243806 A1 | 8/2017 | Iyengar et al. | |
| 2017/0255397 A1* | 9/2017 | Jayasena | G06F 12/10 |
| 2018/0107406 A1* | 4/2018 | O | G06F 3/0611 |
| 2018/0115496 A1* | 4/2018 | Eckert | H04L 47/70 |
| 2018/0218257 A1* | 8/2018 | Xu | G06F 9/4806 |
| 2019/0205244 A1* | 7/2019 | Smith | G06F 3/0613 |
| 2019/0340493 A1* | 11/2019 | Coenen | G06N 3/08 |

OTHER PUBLICATIONS

Computer Architecture Lecture 6: Low-Latency DRAM and Processing in Memory; Mutlu, Onur; Oct. 5, 2017; retrieved from https://safari.ethz.ch/architecture/fall2017/lib/exe/fetch.php?media=onur-comparch-fall2017-lecture6-lowlatencydram-processinginmemory-afterlecture.pdf on Sep. 26, 2019 (Year: 2017).*

Processing in Memory: Chips to Petaflops ; Kogge et al.; In Workshop on Mixing Logic and DRAM: Chips that Compute and Remember at ISCA '97; 1997; retrieved from http://www.cs.ucf.edu/courses/cda5106/summer02/papers/kogge97PIM.pdf on Feb. 25, 2019 (Year: 1997).*

Mapping Irregular Applications to DIVA, a PIM-based Data-Intensive Architecture; Hall et al.; Proceedings of the 1999 ACM/IEEE Conference on Supercomputing; Nov. 13-19, 1999 (Year: 1999).*

3D TSV without Limits; Guillou, Yann; Dec. 4, 2013; retrieved from https://www.3dincites.com/2013/12/3d-tsv-without-limits/ on Sep. 28, 2019 (Year: 2013).*

DRAMA: An Architecture for Accelerated Processing Near Memory; Farmahini-Farahani et al.; IEEE Computer Architecture Letters, vol. 14, iss. 1, pp. 26-29; Jun. 30, 2014 (Year: 2014).*

Processing-in-Memory Enabled Graphics Processors for 3D Rendering; Xie et al.; 2017 IEEE International Symposium on High Performance Computer Architecture; Feb. 4-8, 2017 (Year: 2017).*

A low power 720p motion estimation processor with 3D stacked memory; Zhang et al.; 2014 22nd International Conference on Very Large Scale Integration; Oct. 6-8, 2014 (Year: 2014).*

Air cooling limits of 3D stacked logic processor and memory dies; Kumari et al.; Fourteenth Intersociety Conference on Thermal and Thermomechanical Phenomena in Electronic Systems; May 27-30, 2014 (Year: 2014).*

3-D stacked memory system architecture exploration by esl virtual platform and reconfigurable stacking memory architecture in 3D-DSP SoC system; Hsieh et al.; 2014 IEEE International Conference on Acoustics, Speech and Signal Processing; May 4-9, 2014 (Year: 2014).*

A. Putnam, Large-Scale Reconfigurable Computing in a Microsoft Datacenter, Hot Chips 26, Microsoft "Hot Chips 26," Aug. 12, 2014, located at https://www.microsoft.com/en-us/research/wp-content/uploads/2014/06/HC26.12.520-Recon-Fabric-Pulnam-Microsoft-Catapult.pdf, pp. 1-38.

Jouppi et al., In-Datacenter Performance Analysis of a Tensor Processing Unit, 44th International Symposium on omputer Architecture (ISCA), Toronto, Canada, Jun. 26, 2017, pp. 1-17.

NVIDIA, NVIDIA Tesla P100,The Most Advanced Datacenter Accelerator Ever Built Featuring Pascal GP100, the World's Fastest GPU, White Paper WP-08019-001_v01.1, 2016, pp. 1-45.

* cited by examiner

– 1 –

MEMORY DEVICE PERFORMING PARALLEL ARITHMETIC PROCESSING AND MEMORY MODULE INCLUDING THE SAME

CROSS-REFERENCE TO RELATED APPLICATION

This application claims the benefit of priority to Korean Patent Application No. 10-2017-0152504, filed on Nov. 15, 2017, in the Korean Intellectual Property Office, the disclosure of which is incorporated herein in its entirety by reference.

BACKGROUND

The present disclosure relates to a memory device, and more particularly, to a memory device performing parallel arithmetic processing and a memory module including the same.

Capacity and speed of semiconductor memory devices widely used in high-performance electronic systems have increased. Dynamic random access memory (DRAM) as an example of a semiconductor memory device is volatile memory and determines data based on a charge stored in a capacitor.

DRAM may be used for many purposes. For example, DRAM may be used to store data used for various arithmetic processes or to store arithmetic results. In addition, it may be useful to efficiently use DRAM in processing a huge amount of computations such as neural network computations.

SUMMARY

The disclosed embodiments provide a memory device for processing a large amount of computations in parallel using an arithmetic processing function, and a memory module including the same.

According to an aspect of the inventive concept, a memory module includes a first memory device configured to receive data and first information from a hardware accelerator, to generate an arithmetic result by performing arithmetic processing using the data and the first information, and to output the arithmetic result through an interface that communicates with at least one other memory device; and a second memory device configured to receive the arithmetic result from the first memory device through the interface without using the hardware accelerator, and to store the arithmetic result.

According to another aspect of the inventive concept, a memory module includes an interposer having wiring for signal transmission formed thereon; and a plurality of high bandwidth memories (HBMs) mounted on the interposer. Each of the HBMs includes a buffer die configured to communicate with a device outside each HBM and a plurality of core dies, each of the core dies including a memory cell array and an arithmetic circuit configured to perform arithmetic processing. A first HBM among the plurality of HBMs is configured to receive data from a memory controller through a buffer die and performs arithmetic processing using the data in a plurality of core dies in parallel. The memory module is configured such that an arithmetic result of the first HBM is provided to a second HBM among the plurality of HBMs through data communication between the buffer die of the first HBM and a buffer die of the second HBM.

According to a further aspect of the inventive concept, a memory device includes a first die configured to interface with an external memory controller and an external memory device; a plurality of second dies stacked on the first die, each of the second dies including a memory cell array; and a through-silicon via (TSV) region configured to transmit and receive a signal between the first die and the plurality of second dies. Each of the second dies includes a plurality of channels, each of the channels including an arithmetic circuit configured to perform arithmetic processing using data provided from the external memory controller. The first die includes a first interface circuit configured to receive the data and an arithmetic command by communicating with the external memory controller and to transmit the data to the second dies through the TSV region; and a second interface circuit configured to receive an arithmetic result from the second dies through the TSV region and to output the arithmetic result by communicating with the external memory device.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
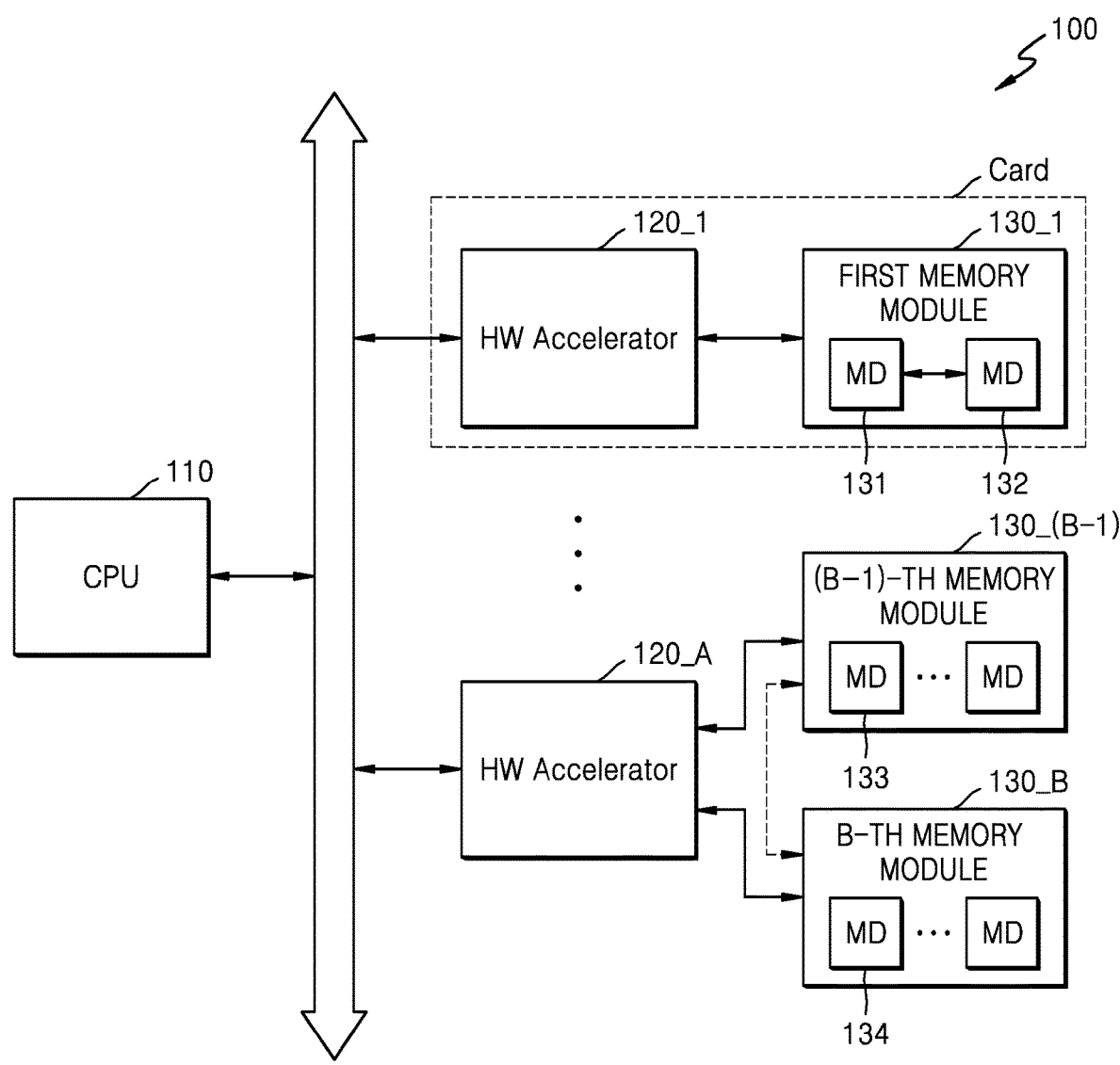
FIG. 1 is a block diagram of a data processing system according to an example embodiment of the inventive concept.

FIG. 1 is a block diagram of a data processing system according to an example embodiment of the inventive concept.

Referring to FIG. 1, a data processing system 100 may include a central processing unit (CPU) 110, one or more hardware (HW) accelerators, for example, first through A-th HW accelerators 120_1 through 120_A, and one or more memory modules, for example, first through B-th memory modules 130_1 through 130_B. The data processing system 100 may also include a bus for communication among components. The bus may support communication among the components connected thereto through various kinds of protocols such as peripheral component interconnect (PCI), PCI Express (PCIe), BlueLink, and QuickPath Interconnection (QPI). The CPU 110 may communicate with the first through A-th HW accelerators 120_1 through 120_A through the bus.

The data processing system 100 may be one of various kinds of systems which process data and record the data in the first through B-th memory modules 130_1 through 130_B or process data read from the first through B-th memory modules 130_1 through 130_B. For example, the data processing system 100 may be implemented as a personal computer (PC), a data server, a cloud system, an artificial intelligence server, a network-attached storage (NAS), an internet of things (IoT) device, or a portable electronic device. When the data processing system 100 is a portable electronic device, the data processing system 100 may be a laptop computer, a cellular phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, or the like.

The CPU 110 may control all operations of the data processing system 100. For example, the CPU 110 may provide instructions to the first through A-th HW accelerators 120_1 through 120_A to control the operations of the first through A-th HW accelerators 120_1 through 120_A. The data processing system 100 may also include an operating memory (not shown) storing the instructions, and the CPU 110 may access the operating memory.

The first through A-th HW accelerators 120_1 through 120_A may correspond to various kinds of auxiliary processors. For example, each of the first through A-th HW accelerators 120_1 through 120_A may be one of various kinds of accelerators such as a field-programmable gate array (FPGA), a massively parallel processor array (MPPA), a graphics processing unit (GPU), an application-specific integrated circuit (ASIC), a neural processing unit (NPU), a tensor processing unit (TPU), and a multi-processor system-on-chip (MPSoC).

Each of the first through B-th memory modules 130_1 through 130_B may include at least one memory device (MD). The first through B-th memory modules 130_1 through 130_B may be arranged to correspond to the first through A-th HW accelerators 120_1 through 120_A. For example, the first memory module 130_1 may include a plurality of memory devices MDs, and the first HW accelerator 120_1 may operate as a host for the first memory module 130_1. The first memory module 130_1 may write data to a selected MD or provide data read from the selected MD to the first HW accelerator 120_1, in response to a command and an address from the first HW accelerator 120_1.

The first through A-th HW accelerators 120_1 through 120_A and the first through B-th memory modules 130_1 through 130_B may be implemented in various forms in the data processing system 100. For example, each of the first through B-th memory modules 130_1 through 130_B may be a single in-line memory module (SIMM) or a dual in-line memory module (DIMM) which includes a plurality of MDs mounted on a module board. Alternatively, each of MDs may include a high bandwidth memory (HBM), and a memory module including such MD may be called an HBM module. The HBM module may include a plurality of HBMs mounted on an interposer and at least one HW accelerator.

It may be defined that each of the first through B-th memory modules 130_1 through 130_B includes a plurality of MDs, as shown in FIG. 1. In modified embodiments, it may be defined that each of the first through B-th memory modules 130_1 through 130_B may also include a controller (not shown) which controls memory operations. Although a HW accelerator is provided outside a memory module in the embodiment illustrated in FIG. 1, the HW accelerator may be provided inside the memory module. For example, it may be defined that the first HW accelerator 120_1 is provided inside the first memory module 130_1 (e.g., e.g., mounted on the module board to be part of the memory module).

Although the number of the first through A-th HW accelerators 120_1 through 120_A is A and the number of the first through B-th memory modules 130_1 through 130_B is B in the embodiment illustrated in FIG. 1, the inventive concept is not limited thereto. For example, the number of the first through A-th HW accelerators 120_1 through 120_A may be the same as the number of the first through B-th memory modules 130_1 through 130_B in the data processing system 100.

The data processing system 100 may include the first through A-th HW accelerators 120_1 through 120_A and the first through B-th memory modules 130_1 through 130_B as cards inserted into a board (or a mainboard). For example, an add-in card including at least one HW accelerator and at least one memory module may be inserted into an expansion slot of a board. For example, a card inserted into an expansion slot may include one HW accelerator and one memory module. FIG. 1 shows a structure in which the first HW accelerator 120_1 and the first memory module 130_1 are included in one card. In modified embodiments, a card may include one HW accelerator and a plurality of memory modules, or a plurality of HW accelerators and a plurality of memory modules.

When the bus supports communication complying with a PCI protocol, the card may be a PCI card. When the card includes a HW accelerator, the card may be referred to as a graphics card or an accelerator card. In one example, the data processing system 100 illustrated in FIG. 1 may be defined as including the CPU 110 and a plurality of cards installed in a board.

An MD included in each of the first through B-th memory modules 130_1 through 130_B may be dynamic random access memory (DRAM) such as double data rate (DDR) synchronous DRAM (SDRAM), low power DDR (LPDDR) SDRAM, graphics DDR (GDDR) SDRAM, or Rambus DRAM (RDRAM), but the inventive concept is not limited thereto. For example, an MD may be implemented as nonvolatile memory such as magnetic RAM (MRAM), ferroelectric RAM (FeRAM), phase-change RAM (PRAM), or resistive RAM (ReRAM).

An example of the operation of an MD and a memory module according to example embodiments of the inventive concept will be described below. An HW accelerator may control at least one memory module. For example, it is assumed that the first HW accelerator 120_1 accesses the first memory module 130_1 and the A-th HW accelerator 120_A accesses the (B−1)-th memory module 130 (B−1) and the B-th memory module 130_B.

Under the control of the CPU 110, the first HW accelerator 120_1 may provide write data to the first memory module 130_1 and may read data from the first memory module 130_1. The A-th HW accelerator 120_A may provide write data to the (B−1)-th memory module 130 (B−1) and the B-th memory module 130_B and may read data from the (B−1)-th memory module 130 (B−1) and the B-th memory module 130_B. In certain embodiments, the accesses to the first memory module 130-1, the (B−1)-th memory module 130 (B−1) and the B-th memory module 130_B may all be in parallel.

According to an example embodiment of the inventive concept, each MD may be provided with an I/F circuit supporting data communication between MDs and may include an arithmetic circuit (not shown) performing arithmetic processing using data. One MD may perform arithmetic processing under the control of a corresponding HW accelerator and may provide an arithmetic result to another MD. For example, under the control of the first HW accelerator 120_1, the first MD 131 of the first memory module 130_1 may perform arithmetic processing using data and provide an arithmetic result to the second MD 132 of the first memory module 130_1 without passing through the first HW accelerator 120_1. In this manner, the arithmetic result of the first MD 131 may be directly provided to the second MD 132 and may not need to be provided to the first HW accelerator 120_1. While this arithmetic processing and result providing is occurring, other MDs may concurrently perform arithmetic processing and result providing in a similar manner, in parallel with MD 131 and MD 132. In addition, in some embodiments, a plurality of computations may be processed in one MD at the same time for different channels, and processing results of those computations may be provided to other MDs or other channels of other MDs in parallel.

In a modified embodiment, data communication between MDs may also be performed between other memory modules. For example, the A-th HW accelerator 120_A may control the (B−1)-th memory module 130 (B−1) and the B-th memory module 130_B. The A-th HW accelerator 120_A, the (B−1)-th memory module 130_(B−1), and the B-th memory module 130_B may form a single card, and the (B−1)-th memory module 130 (B−1) and the B-th memory module 130_B may communicate with each other through wiring formed on the card. Under the control of the A-th HW accelerator 120_A, a third MD 133 of the (B−1)-th memory module 130 (B−1) may perform arithmetic processing and provide an arithmetic result directly to a fourth MD 134 of the B-th memory module 130_B without passing through the A-th HW accelerator 120_A.

Through the operation described above, at least a portion of a large amount of arithmetic processing may be performed in the first through B-th memory modules 130_1 through 130_B in a distributed fashion. For example, at least a portion or all of arithmetic processing may be performed in parallel in the first through B-th memory modules 130_1 through 130_B. Other arithmetic processing may be performed in HW accelerators as usual. When arithmetic processing is performed in the first HW accelerator 120_1 and an arithmetic result is stored in the fourth MD 134 of the B-th memory module 130_B, the first HW accelerator 120_1 may provide the arithmetic result to the A-th HW accelerator 120_A, and the A-th HW accelerator 120_A may store the arithmetic result in the fourth MD 134 of the B-th memory module 130_B.

Each memory module described herein includes a module board on which a plurality of memory devices are mounted. The memory devices may be mounted in the various manners described herein, and in some cases other devices may also be mounted on the module board, as shown in various examples herein. Each memory device includes one or more semiconductor memory chips.

According to the example embodiment of the inventive concept described above, since MDs employ a multiport for data communication and various types of communication (e.g., peer-to-peer (P2P) communication) between MDs are supported, bidirectional communication may be performed, and therefore, MDs may directly communicate with each other without combining a processing unit such as an HW accelerator, thereby having a low latency characteristic for a data processing operation. In addition, in such case as neural network computation requiring a huge amount of arithmetic processing, parallel arithmetic processing using a plurality of MDs may be performed in addition to computation performed using an HW accelerator, and therefore, arithmetic processing speed may be increased and cost for implementing a neural network system may be reduced. Moreover, arithmetic processing may be performed in a plurality of MDs in a distributed fashion, thereby enhancing power distribution. Furthermore, a plurality of MDs may have various types of connection architecture, and therefore, when the MDs have full P2P connection architecture, bandwidth characteristics may be enhanced.

Hereinafter, various embodiments of the inventive concept and example operations thereof will be described below. In the embodiments, a GPU will be explained as an example of an HW accelerator, but the inventive concept is not limited thereto and other various types of HW accelerators may be used.

Figure 2A:
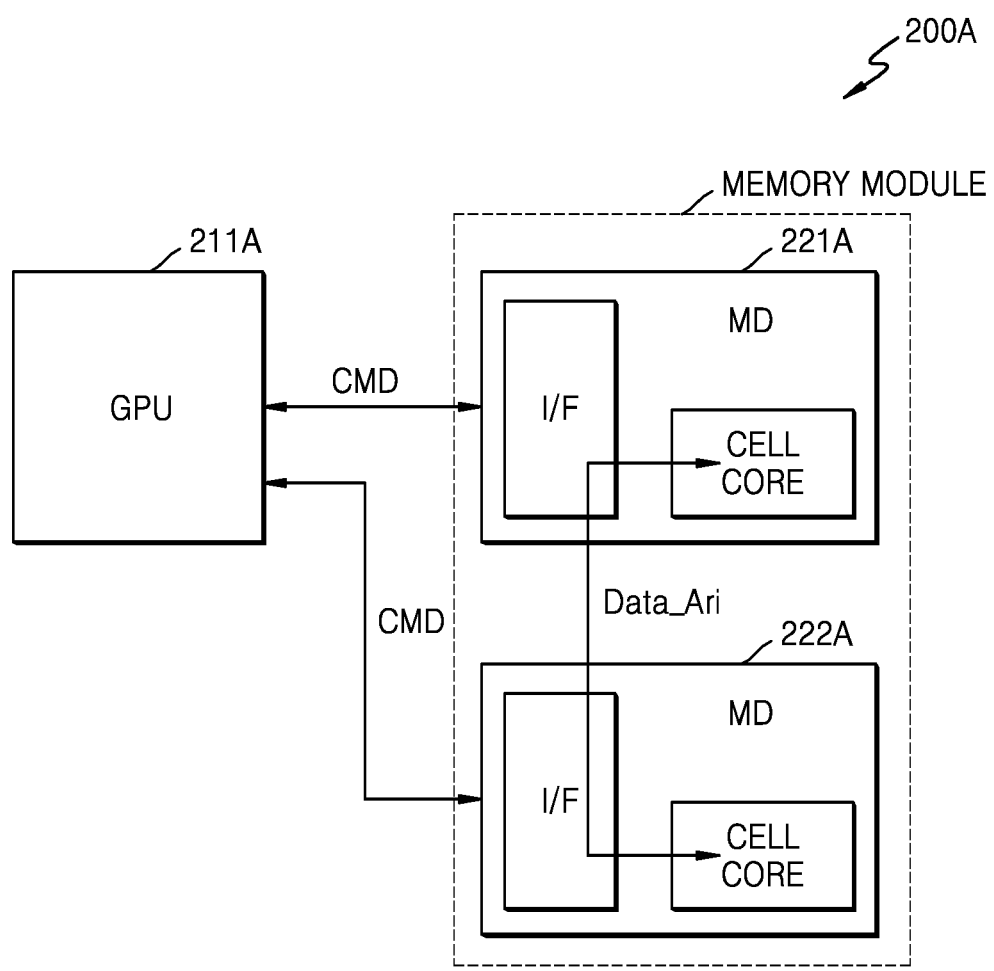
FIGS. 2A through 2C are block diagrams of data communication between memory devices, according to an example embodiment of the inventive concept.
Figure 2B:
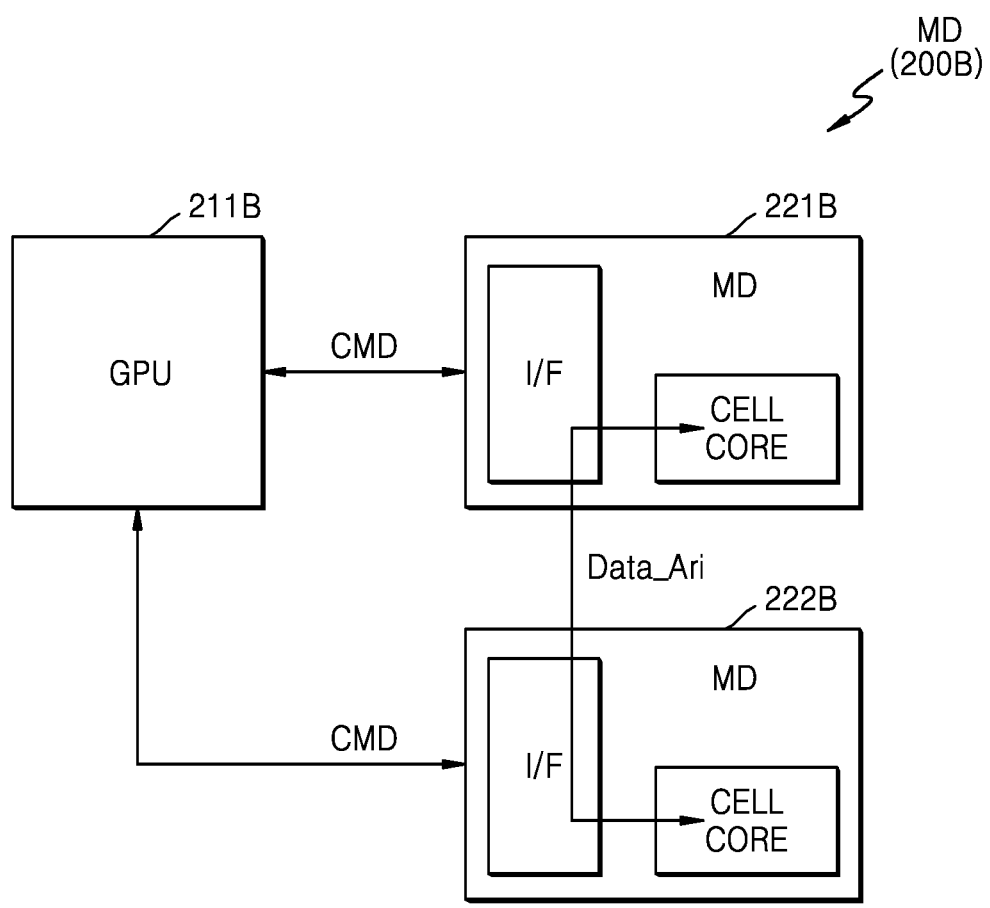
Figure 2C:
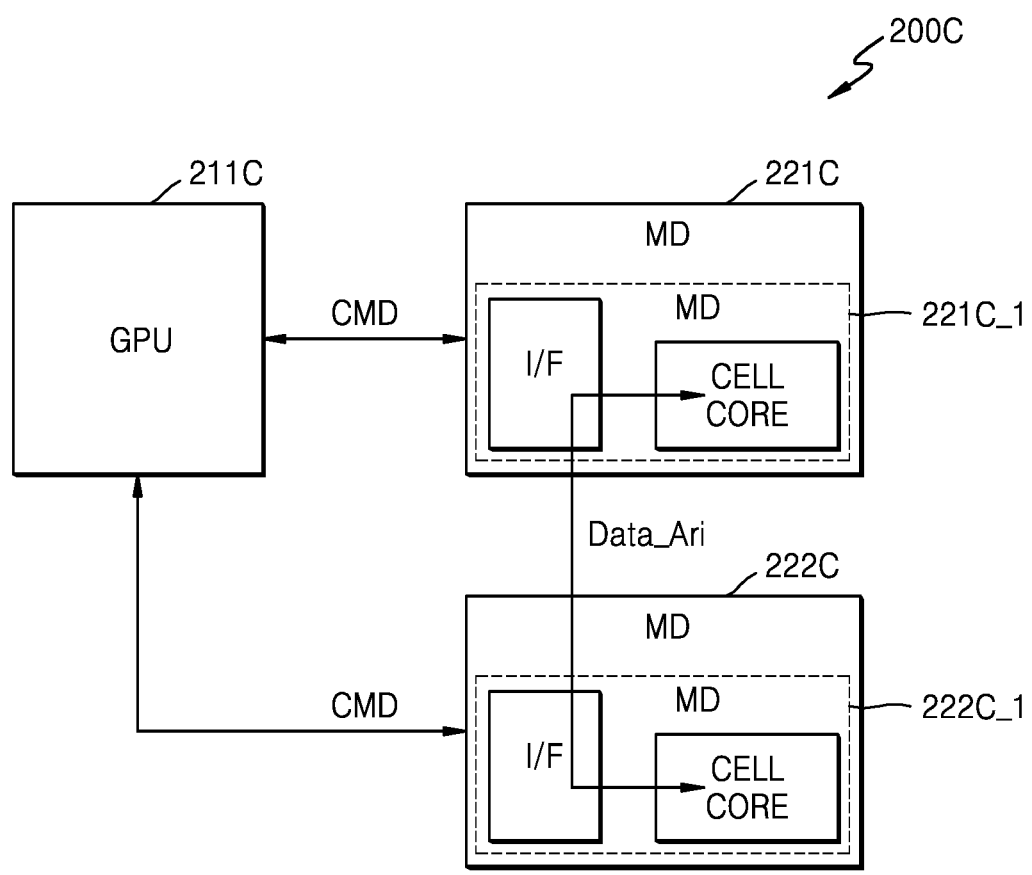

FIGS. 2A through 2C are block diagrams of data communication between MDs, according to an example embodiment of the inventive concept.

Referring to FIG. 2A, a data processing system 200A may include a GPU 211A, a first MD 221A, and a second MD 222A. Data access may be performed on the first and second MDs 221A and 222A under the control of the GPU 211A. In an embodiment, the first and second MDs 221A and 222A may be included in a memory module and the GPU 211A may be provided outside the memory module.

Each of the first and second MDs 221A and 222A may support a multiport option and perform bidirectional communication and arithmetic processing. For example, each of the first and second MDs 221A and 222A may perform arithmetic processing using externally provided data or internally read data, and an arithmetic result Data_Ari from the first MD 221A may be provided to the second MD 222A or the arithmetic result Data_Ari from the second MD 222A may be provided to the first MD 221A.

In an example operation, the GPU 211A may be controlled by a CPU (not shown) in the data processing system 200A. The GPU 211A may provide a command CMD for instructing to perform arithmetic processing to the first MD 221A. The first MD 221A may perform arithmetic processing using data read from a cell core therein or data provided from outside and may provide the arithmetic result Data_Ari directly to the second MD 222A through an interface (I/F) circuit therein. The GPU 211A may also provide a command CMD for instructing to store data to the second MD 222A. The second MD 222A may store the arithmetic result Data_Ari provided from the first MD 221A in a cell core therein in response to the command CMD.

Referring to FIG. 2B, a data processing system 200B may include a GPU 211B, a first MD 221B, and a second MD 222B. The first and second MDs 221B and 222B may be controlled by the GPU 211B. The GPU 211B and the first and second MDs 221B and 222B may be included in one memory module. Under the control of a CPU (not shown), the GPU 211B may provide commands CMD to the first and second MDs 221B and 222B to instruct to perform various memory operations. Similarly to the embodiment described with reference to FIG. 2A, the first MD 221B may perform arithmetic processing in response to a command CMD and may provide the arithmetic result Data_Ari, and the second MD 222B may store the arithmetic result Data_Ari in a cell core therein in response to another command CMD.

Referring to FIG. 2C, a data processing system 200C may include a GPU 211C and a first memory module 221C and a second memory module 222C as one or more memory modules. For example, the GPU 211C, the first memory module 221C, and the second memory module 222C may be provided in one card. The first memory module 221C may transmit and receive signals to and from the second memory module 222C through wiring (e.g., wiring formed on a card). The GPU 211C may provide commands CMD for controlling memory operations of MDs 221C_1 and 222C_1 respectively included in the first and second memory modules 221C and 222C. For example, the arithmetic result Data_Ari from the MD 221C_1 of the first memory module 221C may be provided to the MD 222C_1 of the second memory module 222C without passing through the GPU 211C.

According to the embodiments illustrated in FIGS. 2A through 2C, data communication between an HW accelerator and MDs may not be required, and data may be transmitted between the MDs at a high speed. For example, arithmetic processing is performed in a plurality of MDs in a distributed fashion, and arithmetic results may be transmitted directly between the MDs.

Figure 3:
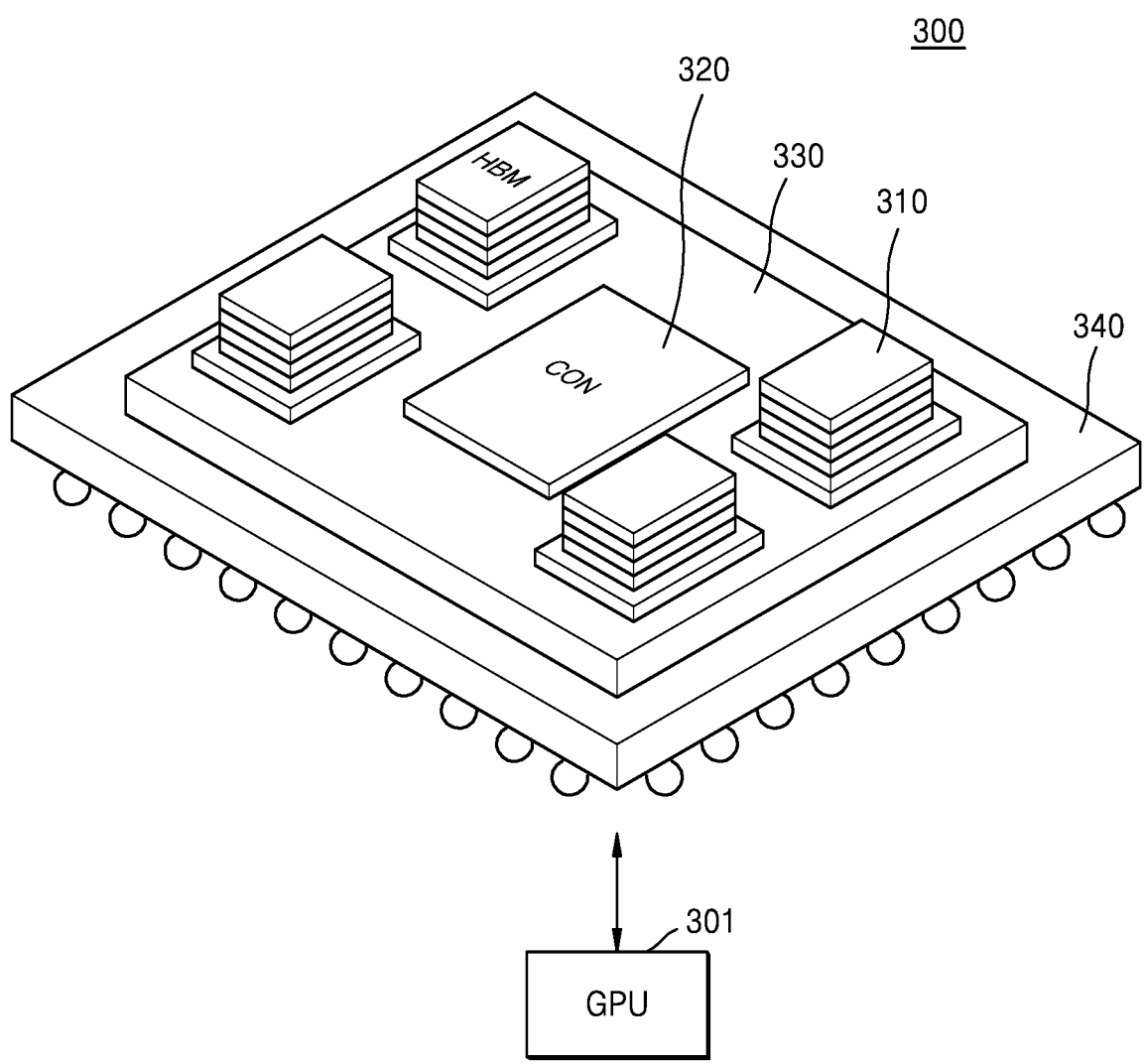
FIG. 3 is a diagram of an exemplary implementation of a memory module in a data processing system.

FIG. 3 is a diagram of an exemplary implementation of a memory module in a data processing system. FIG. 3 illustrates a semiconductor package as a memory module including a memory controller and at least one MD. In the exemplary implementation, at least one semiconductor package may be mounted on a single card (e.g., a graphics card), and each MD is an HBM.

Referring to FIG. 3, a semiconductor package 300 may include a plurality of HBMs 310, a memory controller 320, an interposer 330, and a package substrate 340. The HBMs 310 and the memory controller 320 may be mounted on the interposer 330 and may communicate signals with one another through wiring formed on the interposer 330. The interposer 330 may include a through-silicon via (TSV) type of wiring, a printed circuit board (PCB) type of organic wiring, or a non-TSV type of wiring such as an embedded multi-die interconnect bridge (EMIB).

In a modified embodiment, the semiconductor package 300 may include only a plurality of the HBMs 310 without the memory controller 320. For example, the semiconductor package 300 may perform data access under the control of an external memory control unit. As shown in FIG. 3, data access to the HBMs 310 may be controlled under the control of an external HW accelerator (e.g., the GPU 301).

In another modified embodiment, other various kinds of semiconductor chips instead of the memory controller 320 may be included in the semiconductor package 300. For example, the GPU 301 shown in FIG. 3 may be included in the semiconductor package 300 or an application processor (AP) including a device (e.g., an intellectual property (IP) block) with a memory control function may be included in the semiconductor package 300.

The HBMs 310 shown in FIG. 3 may perform the communication described above in the embodiments. In an exemplary implementation, wiring corresponding to signal transmission paths among the HBMs 310 may be provided in the interposer 330, and data may be transmitted from one of the HBMs 310 to at least one other of the HBMs 310. For example, as described above, each of the HBMs 310 may include an arithmetic circuit and may perform arithmetic processing under the control of the GPU 301 and provide an arithmetic result to another HBM 310. In an embodiment, each of the HBMs 310 may include a buffer die (or a logic die), which includes a control logic, as a peripheral circuit for controlling memory operations and one or more core dies including a memory cell array, and an arithmetic circuit may be provided in each of the core dies.

Figure 4:
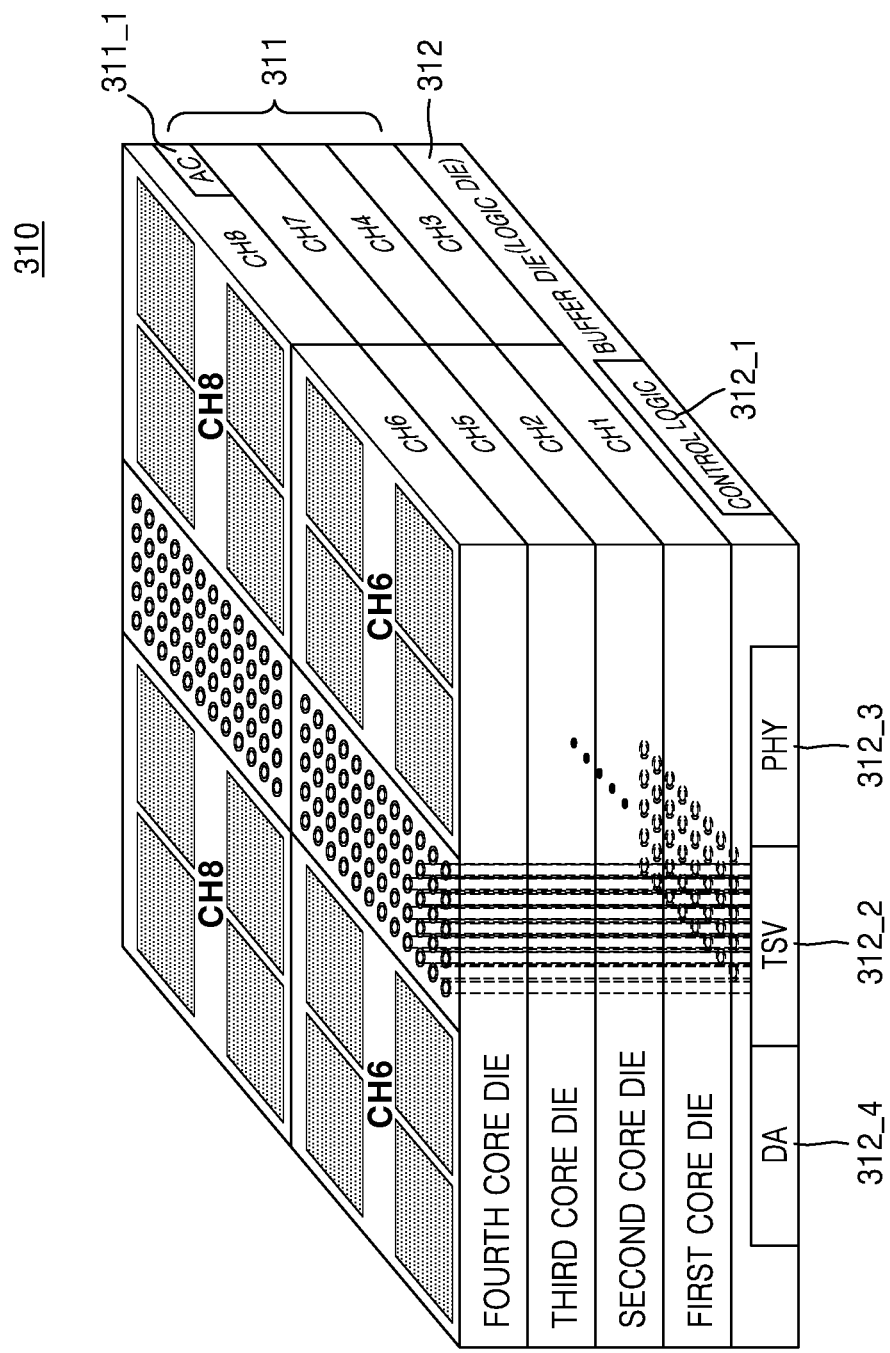
FIG. 4 is a diagram of an exemplary implementation of a high bandwidth memory (HBM) shown in FIG. 3.

FIG. 4 is a diagram of an exemplary implementation of each of the HBMs 310 shown in FIG. 3. The structure of the HBMs 310 will be described using one of the HBMs 310 below.

The HBM 310 may have an increased bandwidth by including a plurality of channels having an independent I/F. Referring to FIG. 4, the HBM 310 may include a plurality of dies, for example, a buffer die (or a logic die) 312 and one or more core dies, for example, first through fourth core dies 311, stacked on the buffer die 312. The first through fourth core dies 311 are included in the HBM 310 in the exemplary implementation illustrated in FIG. 4, but the number of the core dies 311 may vary.

Each of the core dies 311 may include at least one channel. In the exemplary implementation illustrated in FIG. 4, each of the core dies 311 includes two channels, and therefore, the HBM 310 has eight channels CH1 through CH8. For example, a first core die may include the first channel CH1 and the third channel CH3, a second core die may include the second channel CH2 and the fourth channel CH4, a third core die may include the fifth channel CH5 and the seventh channel CH7, and a fourth core die may include the sixth channel CH6 and the eighth channel CH8.

The buffer die 312 may communicate with an external memory controller (or an HW accelerator), receive commands, addresses, and data from the memory controller, and provide the commands, the addresses, and the data to the core dies 311. The buffer die 312 may communicate with the memory controller through a conductive member (not shown) such as a bump formed on an outer surface thereof. The buffer die 312 may buffer a command, an address, and data. Accordingly, the memory controller may interface with the core dies 311 by driving only the load of the buffer die 312.

The HBM 310 may also include a plurality of TSVs penetrating through the core dies 311 and the buffer die 312. The TSVs may be provided corresponding to a plurality of the first through eighth channels CH1 through CH8. When each of the first through eighth channels CH1 through CH8 has a 128-bit bandwidth, the TSVs may include composition for input and output of 1024-bit data.

In an embodiment, the HBM 310 may perform arithmetic processing, and an arithmetic circuit (AC) 311_1 may be provided in the buffer die 312 and/or the core dies 311. In an exemplary implementation, an arithmetic circuit may be provided in each of the core dies 311, and therefore, a plurality of arithmetic processing operations performed in the HBM 310 may be performed in the core dies 311 in a distributed fashion. Although the arithmetic circuit 311_1 is provided in the eighth channel CH8 of the fourth core die in FIG. 4, the arithmetic circuit 311_1 may be provided in each of the core dies 311 or each of the first through eighth channels CH1 through CH8.

The buffer die 312 may include a control logic 312_1, a TSV region 312_2, a physical (PHY) region 312_3, and a direct access (DA) region 312_4. The control logic 312_1 may control all operations of the HBM 310. For example, the control logic 312_1 may perform internal control in response to a command from an external memory controller. Each of the core dies 311 may perform arithmetic processing and transmit an arithmetic result under the control of the control logic 312_1.

The TSV region 312_2 is a region in which TSVs for communication with the core dies 311 are formed. The PHY region 312_3 may include a plurality of input/output circuits for communication with an external memory controller and a plurality of input/output circuits for communication with other HBMs. For example, the PHY region 312_3 may include a plurality of ports, and one of the ports may communicate with an external memory controller and another one of the ports may communicate with another HBM.

The DA region 312_4 may directly communicate with an external tester through a conductive member provided on an outer surface of the HBM 310 in a test mode of the HBM 310. Various signals from the tester may be provided to the core dies 311 through the DA region 312_4 and the TSV region 312_2. In a modified embodiment, various signals from the tester may be provided to the core dies 311 through the DA region 312_4, the PHY region 312_3, and the TSV region 312_2.

According to the embodiments described above, a bandwidth per channel of HBMs may be used when arithmetic results are transmitted among the HBMs, and therefore, the bandwidth of the channels may be efficiently used and data latency may be reduced with respect to a large amount of computations.

Figure 5:
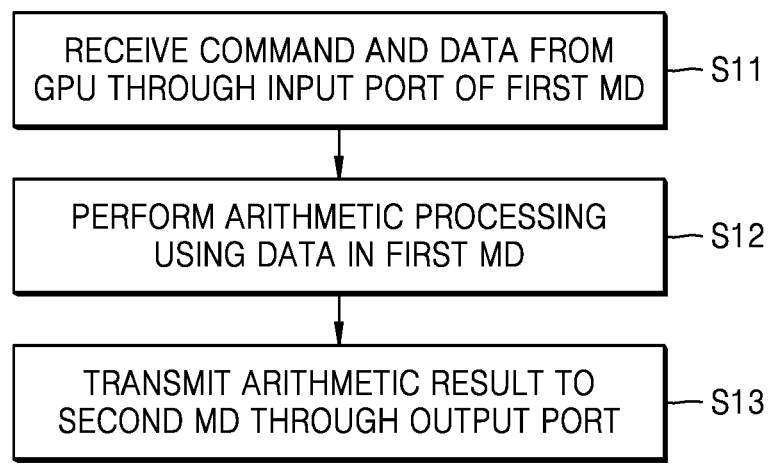
FIG. 5 is a flowchart of a method of operating a memory device according to an example embodiment of the inventive concept.

FIG. 5 is a flowchart of a method of operating an MD according to an example embodiment of the inventive concept. FIG. 5 illustrates a method of operating one MD (e.g., a first MD).

Referring to FIG. 5, the first MD may perform memory operations under the control of an external memory controller (or a GPU as an example of an HW accelerator). The first MD may also perform arithmetic processing when the first MD includes an arithmetic circuit according to the embodiment described above. In addition, the first MD may communicate with at least one other MD. For example, the first MD may exchange data with a second MD.

The first MD may include an input port and an output port. The first MD may receive a command and data from the GPU through the input port in operation S11. In an embodiment, the first MD may include a plurality of I/F circuits and may use one of the I/F circuits as the input port and another one of the I/F circuits as the output port. The first MD may perform arithmetic processing in response to various commands. The first MD may perform arithmetic processing in response to a predefined command (e.g., a write command) or a newly defined command. The first MD may perform arithmetic processing using data provided from the GPU in operation S12.

The arithmetic result may be stored in the second MD outside the first MD under the control of the GPU. At this time, the first MD may exchange data with the second MD. The arithmetic result may be directly transmitted to the second MD through the output port of the first MD in operation S13.

Figure 6:
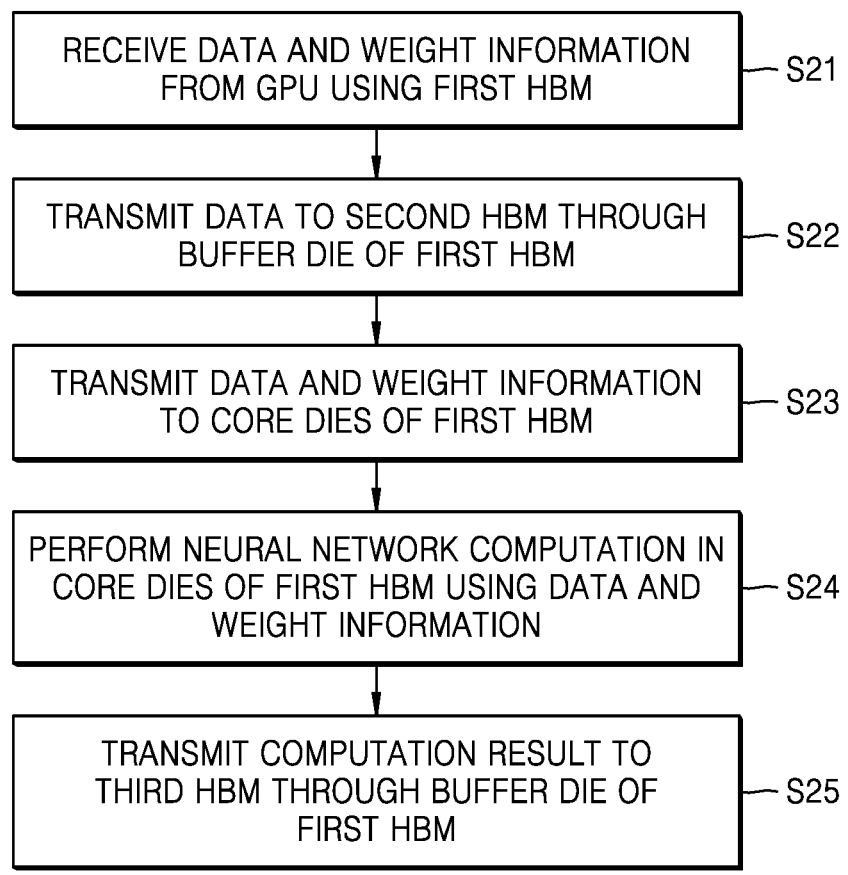
FIG. 6 is a flowchart of a method of operating a memory device according to another example embodiment of the inventive concept.

FIG. 6 is a flowchart of a method of operating an MD according to another example embodiment of the inventive concept. In the embodiment illustrated in FIG. 6, an HBM is an MD and performs neural network computation under the control of an HW accelerator such as a GPU.

Referring to FIG. 6, a first HBM may receive data and first weight information from the GPU in operation S21. The data and the first weight information are used for neural network computation. Similarly to the example described above, the first HBM may also receive a command for performing the computation from the GPU.

Figure 8:
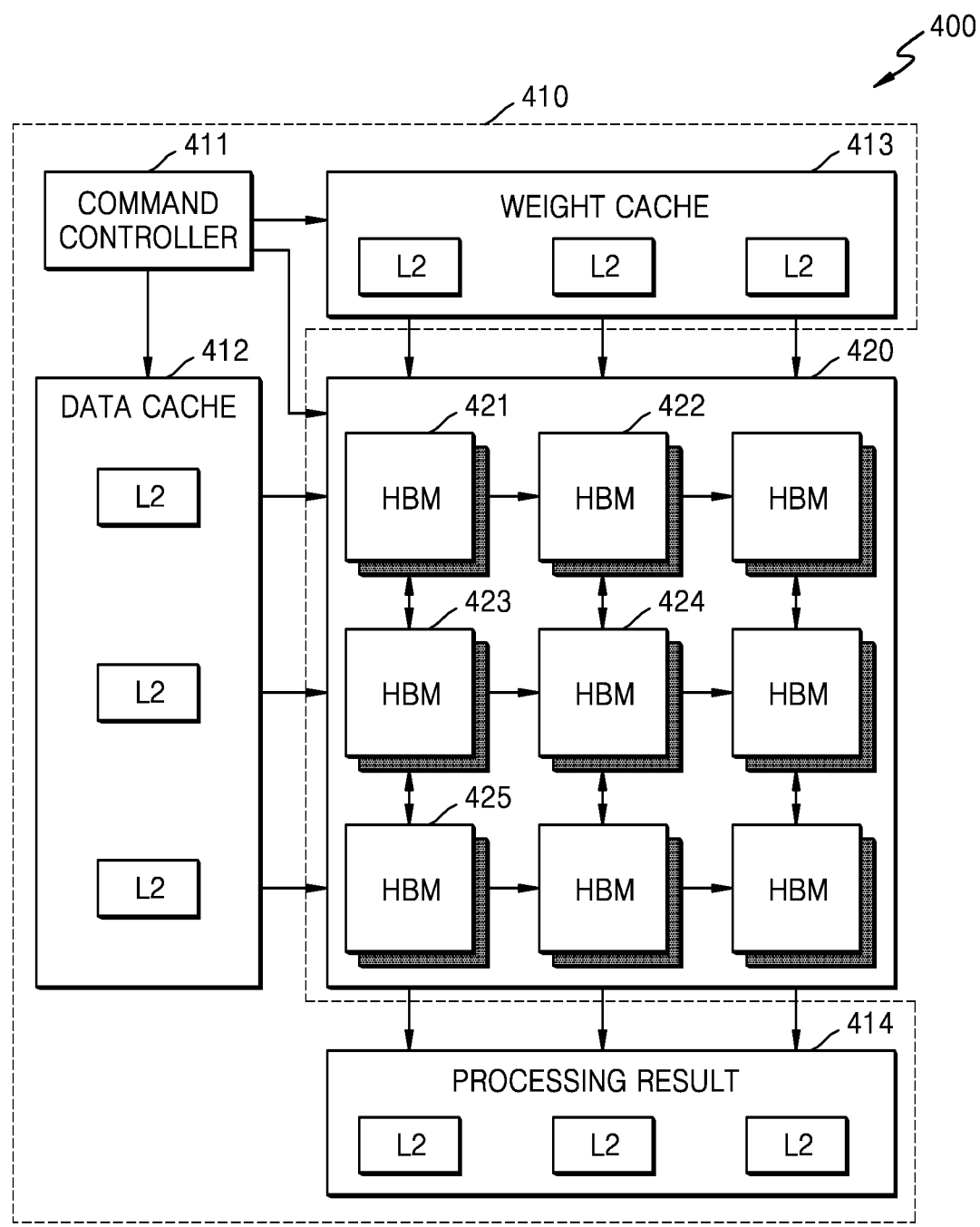
FIG. 8 is a block diagram of the operation of a data processing system, according to an example embodiment of the inventive concept.

The first HBM may include a buffer die and one or more core dies. The neural network computation may include parallel arithmetic operations of data using a plurality of weights. At this time, when a second HBM performs arithmetic processing using data and second weight information, which have been received from the GPU, the first HBM may transmit the data to the second HBM through the buffer die in operation S22. In this manner, the first HBM may be bypassed. As an example, as shown in FIG. 8, a first HBM 421 may receive data for use in computation of a second HBM 422 from the data cache 412, and may transmit the data to the second HBM 422 without extra processing, thereby bypassing the first HBM 421.

The first HBM may transmit the data and the first weight information to the one or more core dies in operation S23. The one or more core dies may perform the neural network computation using the data and the first weight information in operation S24 and may transmit the neural network computation result to the buffer die of the first HBM. The first HBM may transmit the neural network computation result to a third HBM through the buffer die in operation S25.

Figure 7:
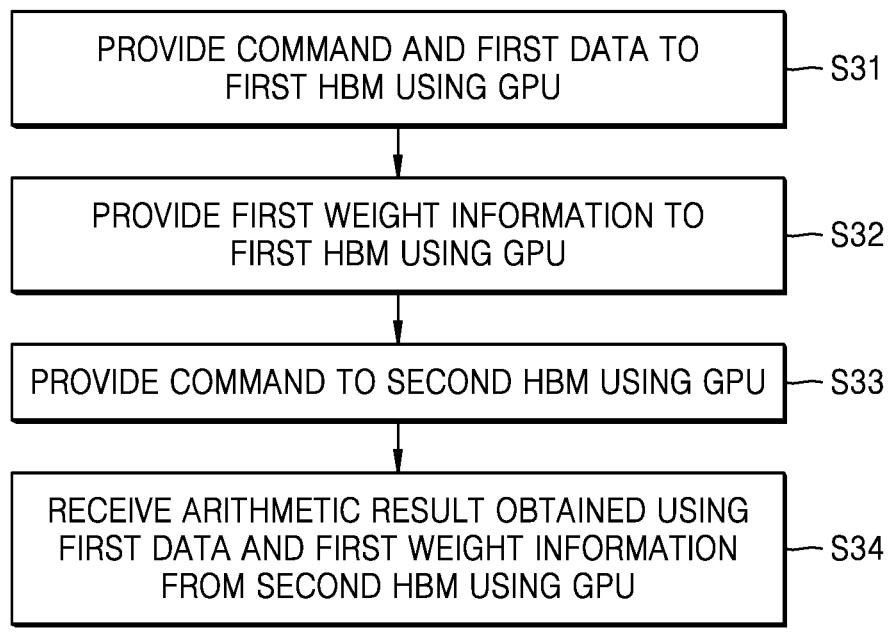
FIG. 7 is a flowchart of a method of operating a data processing system including a memory module, according to an example embodiment of the inventive concept.

FIG. 7 is a flowchart of a method of operating a data processing system including a memory module, according to an example embodiment of the inventive concept. As in the embodiments described above, the data processing system may include a memory module, which includes a plurality of HBMs, and a GPU as an HW accelerator controlling the HBMs.

Referring to FIG. 7, the GPU may provide first data and a command for neural network computation to a first HBM in operation S31. The GPU may also provide the first HBM with first weight information to be used together with the first data for the neural network computation in operation S32. According to the embodiments described above, the HBMs may exchange data with one another, and the neural network computation result of the first HBM may be transmitted from the first HBM to a second HBM and stored in the second HBM.

Alternatively, the neural network computation result of the first HBM may be provided to the GPU through the second HBM. The GPU may provide the second HBM with a command for receiving the neural network computation result (e.g., a first arithmetic result) obtained using the first data and the first weight information in operation S33. The GPU may receive the first arithmetic result in operation S34. In a modified embodiment, the second HBM may receive second weight information from the GPU and generate a second arithmetic result by performing neural network computation using the first arithmetic result and the second weight information. The GPU may receive the second arithmetic result from the second HBM.

FIG. 8 is a block diagram of the operation of a data processing system 400, according to an example embodiment of the inventive concept. The data processing system 400 may include an HW accelerator 410 and a memory module 420 including a plurality of HBMs corresponding to the HW accelerator 410. In the embodiment illustrated in FIG. 8, an arithmetic operation (e.g., multiplication) using data and a weight is performed. An arithmetic operation using the weight may correspond to neural network computation.

Figure 9:
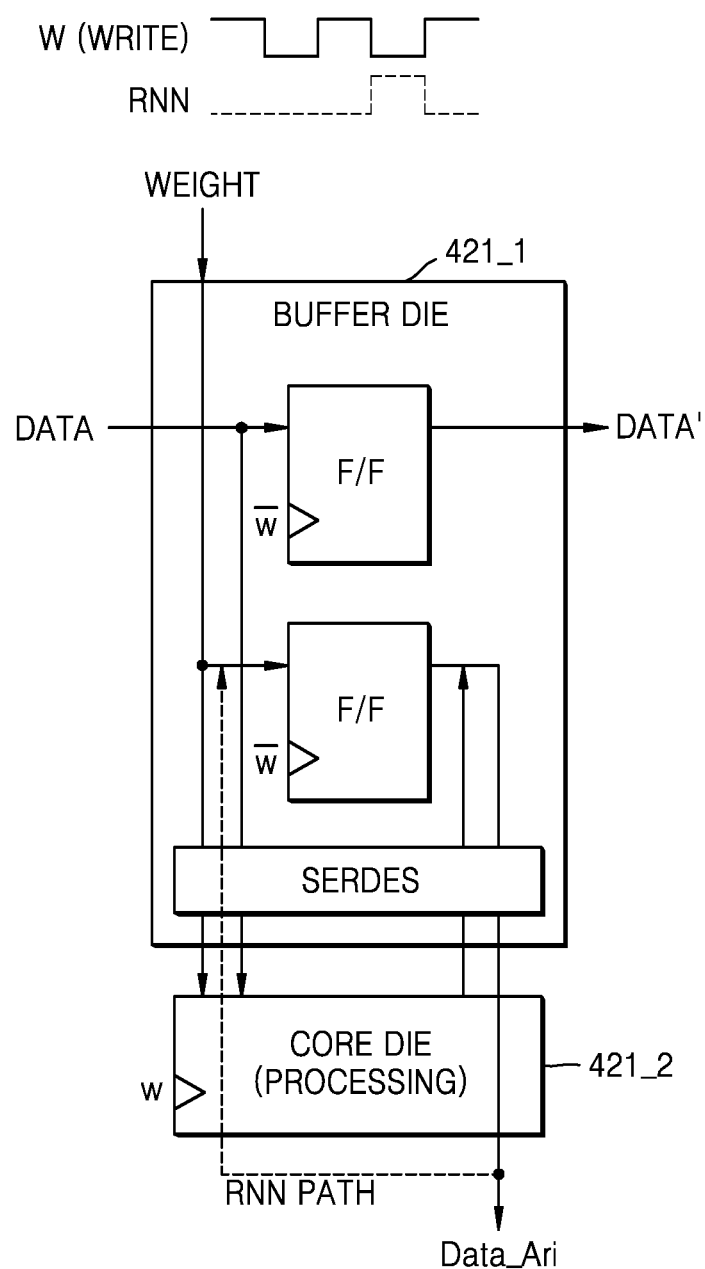
FIG. 9 is a block diagram of an example of arithmetic processing.

Referring to FIGS. 8 and 9, the HW accelerator 410 may include a command controller 411 and one or more caches, e.g., first through third caches 412, 413, and 414. The first through third caches 412 through 414 may be various kinds of caches. In the current embodiment, the first through third caches 412 through 414 may be L2 caches. The first cache 412 may be used to store data that undergoes an arithmetic operation. The second cache 413 may be used to store a weight. The third cache 414 may be used to store an arithmetic operation result obtained using the data and the weight.

The HBMs of the memory module 420 may be connected in various types of architecture and may communicate with one another. FIG. 8 shows systolic architecture in which each of the HBMs transmits a signal to an adjacent HBM under the control of the command controller 411, but the HBMs may have various types of connection architecture such as ring connection architecture, partially connected architecture, fully connected architecture, torus network architecture, and crossbar switch architecture. FIG. 8 shows an example in which the HBMs are arranged in three rows and three columns.

The operation of the data processing system 400 will be described below with reference to first through fifth HBMs 421 through 425 of the memory module 420.

In response to a command from the command controller 411, data may be provided from the first cache 412 to the first HBM 421 and a weight may be provided from the second cache 413 to the first HBM 421. The first HBM 421 may include a buffer die 421_1 and a plurality of core dies 421_2. The data and the weight may be provided to the core dies 421_2 through the buffer die 421_1. For example, a plurality of pieces of data and a plurality of weights, which are used for an arithmetic operation, may be distributed to the core dies 421_2. Each of the core dies 421_2 may perform an arithmetic operation (e.g., multiplication) using data and a weight under the internal control of the first HBM 421.

The data from the first cache 412 may be provided to the second HBM 422 through the first HBM 421, and the second HBM 422 may receive a weight from the second cache 413. A plurality of core dies included in the second HBM 422 may perform an arithmetic operation using the data and the weight. In addition, the second HBM 422 may also transmit (or bypass) the data received through the first HBM 421 to another HBM (e.g., an adjacent HBM on the right) in the same row as the second HBM 422.

Meanwhile, an arithmetic result may be transmitted directly between HBMs without passing through the HW accelerator 410. For example, the first HBM 421 may communicate with the third HBM 423 through an interface and may provide an arithmetic result to the third HBM 423.

In an embodiment, an arithmetic result of the core dies 421_2 of the first HBM 421 may be provided to the buffer die 421_1 and then provided to the third HBM 423 through communication between the buffer die 421_1 of the first HBM 421 and a buffer die of the third HBM 423.

The arithmetic result may be stored in an HBM at any one of various positions. For example, the arithmetic result of the first HBM 421 may be provided to the third HBM 423 through the communication described above and stored in a cell array of a core die included in the third HBM 423 or may be provided to the fifth HBM 425 through the third HBM 423 and stored in a cell array of a core die included in the fifth HBM 425. In addition, when the arithmetic result is provided to the HW accelerator 410, the arithmetic result may be provided to the third cache (e.g., a processing result cache) 414 of the HW accelerator 410 through the fifth HBM 425.

In this manner, a plurality of HBMs may comprise HBMs arranged in A rows and B columns, where A and B are integers of at least 2. A first HBM may be in the same column as a second HBM. In one embodiment, B HBMs in one row respectively receive different weights from the memory controller in parallel, data from the hardware accelerator is transmitted to the B HBMs sequentially in one direction, and each of the B HBMs performs a neural network computation using a respective piece of data and a corresponding weight from among the different weights. In one embodiment, each of the different weights from the hardware accelerator is transmitted to A HBMs sequentially in one column.

In the embodiment described above, arithmetic processing is performed in HBMs in a first row of the memory module 420. However, HBMs of the memory module 420 may perform arithmetic processing in various manners. For example, HBMs in a second row may receive data from the first cache 412 in a manner which is the same as or similar to that described above, may receive a weight from the second cache 413 through the HBMs in the first row, and may perform arithmetic processing using the data and the weight. An arithmetic result may be may be stored in an HBM at any one of various positions and may also be provided to the third cache 414 of the HW accelerator 410 through HBMs in a third row.

Alternatively, the HBMs in the second row of the memory module 420 may receive an arithmetic result from the HBMs in the first row and may perform arithmetic processing using the arithmetic result from the HBMs in the first row and a weight provided from the second cache 413. The arithmetic result of the HBMs in the second row may be stored in HBMs at different positions and may also be provided to the third cache 414 of the HW accelerator 410 through the HBMs in the third row.

According to the embodiment illustrated in FIG. 8, a huge amount of computations processed in a neural network or the like may be processed in a plurality of HBMs in a distributed fashion, and therefore, a processing speed may be increased. In addition, an arithmetic result may be stored in an HBM at a different position through data communication among the plurality of HBMs, without using the HW accelerator 410 outside the memory module 420.

As described above, a plurality of HBMs may communicate with one another bidirectionally, and therefore, an arithmetic result that has been stored in one of the HBMs may be provided to other HBMs without passing through the HW accelerator 410 outside the memory module 420. In an example operation, recurrent neural network (RNN) computation may be performed as an example of a deep learning method in neural network computation. At this time, an arithmetic result that has been processed and stored may be used as recurrent data. For example, under the control of the HW accelerator 410, an existing arithmetic result that has been stored in HBMs may be provided to other HBMs and an arithmetic operation (e.g., multiplication of the existing arithmetic result by a weight) using the existing arithmetic result may be performed. When the existing arithmetic result has been stored in the third HBM 423, the existing arithmetic result may be read from the third HBM 423 and provided to the first HBM 421 under the control of the HW accelerator 410. In addition, the first HBM 421 may also receive a weight together with the existing arithmetic result and perform arithmetic processing using the weight and the existing arithmetic result.

A plurality of HBMs may be connected in various types of architecture besides the connection architecture shown in FIG. 8, as described above, and data, an arithmetic result, and a weight may be transmitted and received between HBMs through connection architecture. Accordingly, neural network computation may be performed in the plurality of HBMs in a distributed fashion, an arithmetic result may be provided to at least some of the plurality of HBMs, and a neural network processing result may be produced through repetition of such arithmetic processing.

FIG. 9 is a block diagram of an example of arithmetic processing. FIG. 9 illustrates the buffer die 421_1 and one core die 421_2, which are included in the first HBM 421 shown in FIG. 8. In the example illustrated FIG. 9, it is assumed that the buffer die 421_1 receives data and a weight from an external HW accelerator.

Referring to FIGS. 8 and 9, the buffer die 421_1 may receive data and a weight in response to a predetermined clock signal. For example, the buffer die 421_1 may include a flip-flop (F/F) which receives data and a weight in response to a write command W (w or/w). The data may be provided to another adjacent HBM. For example, the buffer die 421_1 may provide data DATA' output from the F/F to the second HBM 422.

The buffer die 421_1 may also provide the data and the weight to the core die 421_2. For example, serial-parallel conversion may be performed on the data or the arithmetic result Data_Ari transmitted between the buffer die 421_1 and the core die 421_2, and a converter SERDES may be included in the buffer die 421_1. For example, the data and the weight from the buffer die 421_1 may be provided to the core die 421_2 through the converter SERDES. The converter SERDES may convert serial data to parallel data or parallel data to serial data through serial-parallel conversion.

The arithmetic result Data_Ari from the core die 421_2 may be provided to the buffer die 421_1. For example, the arithmetic result Data_Ari may be provided to the buffer die 421_1 through the converter SERDES. The arithmetic result Data_Ari may be stored in another HBM. The arithmetic result Data_Ari may be read from another HBM and provided to the buffer die 421_1 in response to the control (e.g., a read command RNN) of an HW accelerator when an arithmetic result that has been stored before is used. The core die 421_2 may receive the arithmetic result Data_Ari and the weight through the buffer die 421_1 and may perform arithmetic processing using the arithmetic result Data_Ari and the weight. As described above, an arithmetic result obtained using the arithmetic result Data_Ari and the weight may be provided directly to another HBM without passing through the HW accelerator. Thus, based on the above description, the buffer die 421_1 of a first HBM comprises a converter and performs serial-parallel conversion on at least one among the data and an arithmetic result, the data being provided to core dies (e.g., 421_2), and the arithmetic result being received from core dies (e.g., 421_2).

The weight received through the buffer die 421_1 may be transmitted (or bypassed) to another HBM. In the example illustrated in FIG. 9, the weight is provided to another HBM through an F/F.

Figure 10:
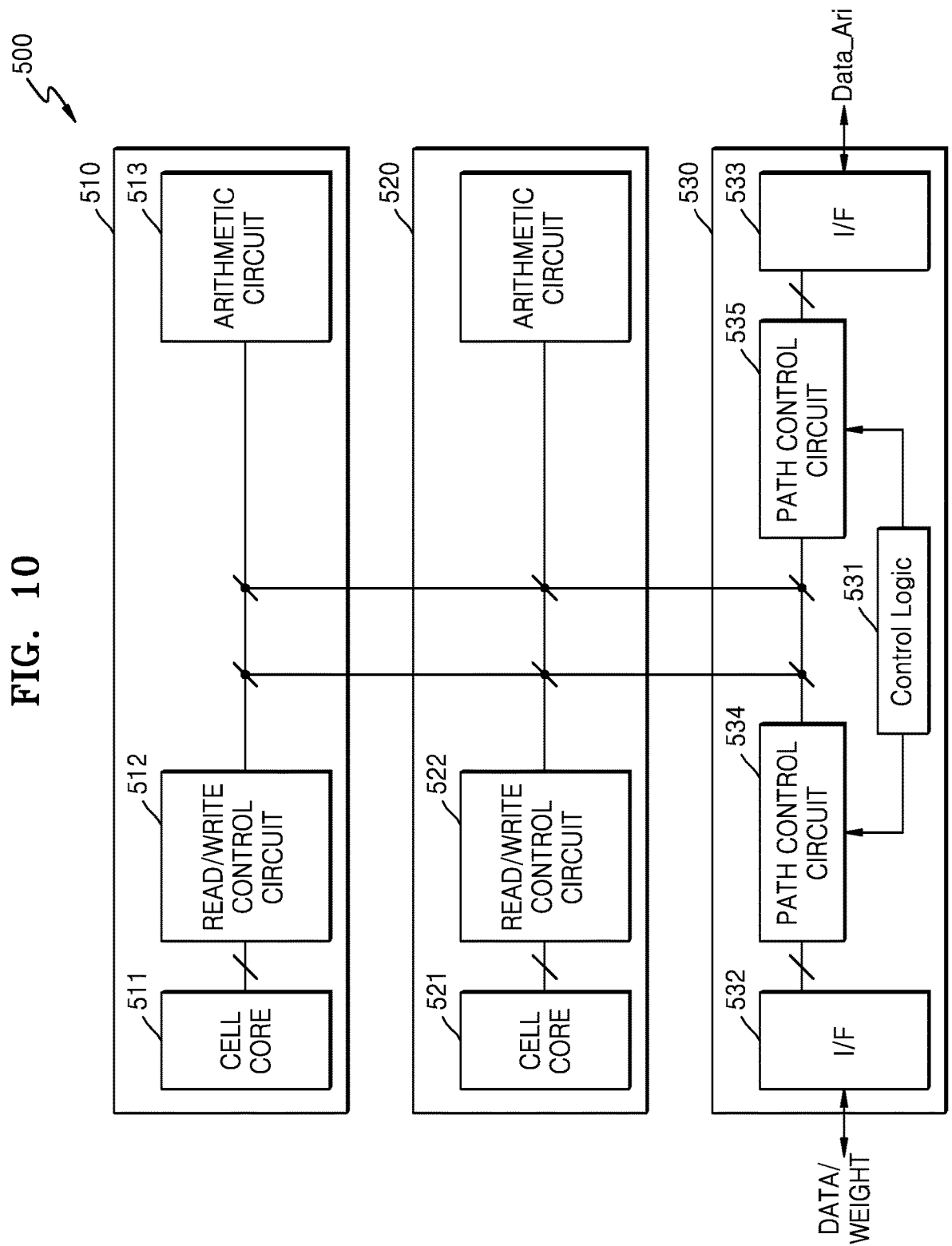
FIG. 10 is a block diagram of an exemplary implementation of an HBM, according to an example embodiment of the inventive concept.

FIG. 10 is a block diagram of an exemplary implementation of an HBM, according to an example embodiment of the inventive concept. FIG. 10 illustrates a buffer die and two core dies stacked on the buffer die. Components such as an F/F used to transmit the data and the weight in FIG. 9 may be included in I/F circuits in FIG. 10.

Each of first and second core dies 510 and 520 of an HBM 500 may include a cell core and a read/write control circuit and an arithmetic circuit according to the embodiments described above. For example, the first core die 510 may include a cell core 511 including a plurality of memory cells, a read/write control circuit 512 controlling a data transfer path between the cell core 511 and a buffer die 530, and an arithmetic circuit 513. The buffer die 530 may include at least two I/Fs, for example, a first I/F circuit 532 communicating with an external processing unit (e.g., an HW accelerator) and a second I/F circuit 533 communicating with another HBM.

The buffer die 530 may also include a control logic 531 controlling all operations of the HBM 500 and path control circuits 534 and 535 controlling paths of signals to be provided to the first and second core dies 510 and 520 or paths of signals received from the first and second core dies 510 and 520. The control logic 531 may control the path control circuits 534 and 535 based on a command from the external processing unit, may control data and a weight from the external processing unit to be provided to the first and second core dies 510 and 520 through the path control circuit 534, and may control the arithmetic result Data_Ari from either of the first and second core dies 510 and 520 to be provided to another HBM through the path control circuit 535 and the second I/F circuit 533. Under the control of the control logic 531, a signal path may be controlled such that a signal received through the first I/F circuit 532 is bypassed outside through the second I/F circuit 533 without being provided to the first and second core dies 510 and 520.

Figure 11:
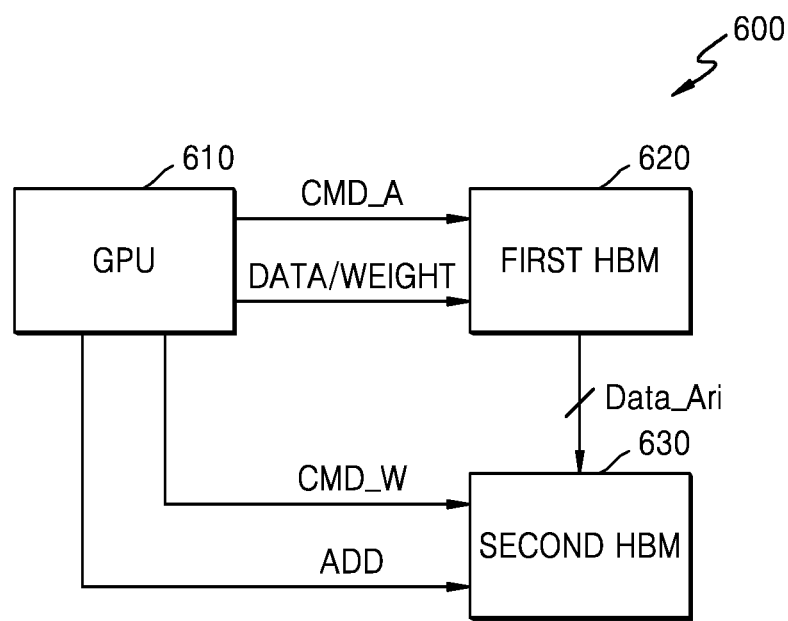
FIGS. 11 and 12 are block diagrams of examples of the operation of data processing systems.
Figure 12:
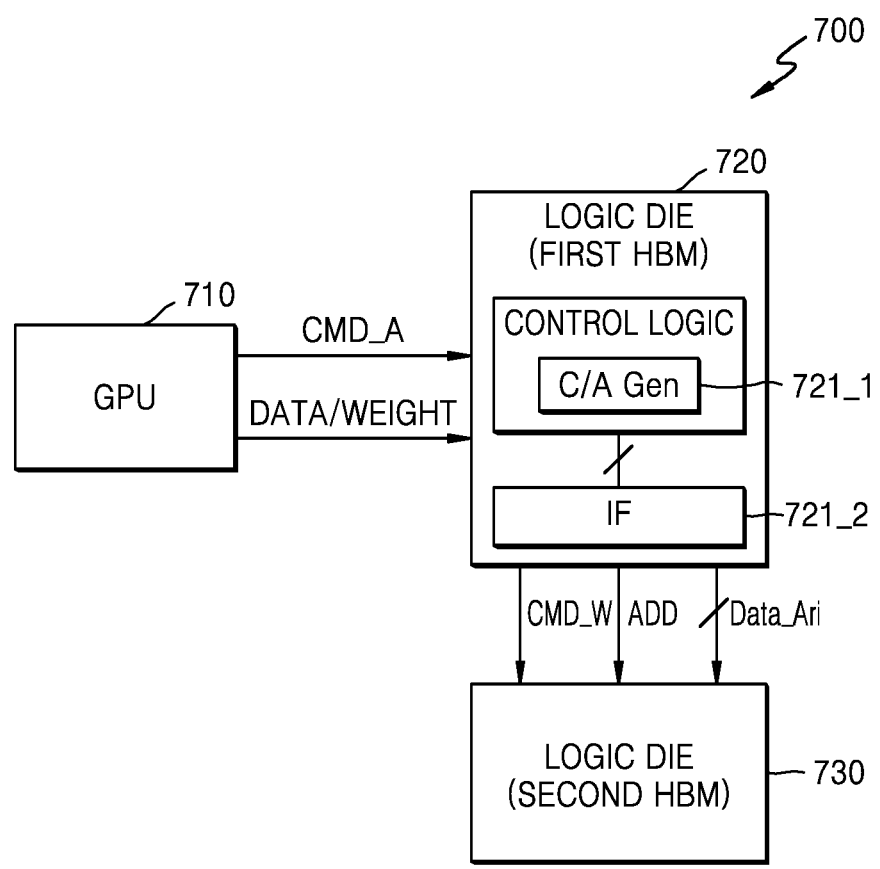

FIGS. 11 and 12 are block diagrams of examples of the operation of data processing systems. FIGS. 11 and 12 show examples in which an HW accelerator provides data to an HBM according to real-time data processing.

Referring to FIG. 11, a data processing system 600 may include a GPU 610 as an HW accelerator and a plurality of first and second HBMs 620 and 630. At this time, the first HBM 620 may perform arithmetic processing using data and a weight and provide the arithmetic result Data_Ari to the second HBM 630.

The GPU 610 may provide a command CMD_A for arithmetic processing to the first HBM 620. The GPU 610 may also provide data and a weight to the first HBM 620. The first HBM 620 may perform arithmetic processing in response to the command CMD_A. For example, arithmetic circuits included in a plurality of core dies of the first HBM 620 may perform the arithmetic processing using the data and the weight. The first HBM 620 may provide the arithmetic result Data_Ari to the second HBM 630.

The GPU 610 may provide a write command CMD_W for storing the arithmetic result Data_Ari to the second HBM 630. The GPU 610 may also provide the second HBM 630 with an address ADD indicating a position at which the arithmetic result Data_Ari is to be stored. The second HBM 630 may perform a data write operation in response to the write command CMD_W and the address ADD from the GPU 610. For example, the second HBM 630 may store the arithmetic result Data_Ari received through data communication with the first HBM 620 at the position indicated by the address ADD.

Referring to FIG. 12, a data processing system 700 may include a GPU 710 as an accelerator and a plurality of first and second HBMs 720 and 730. FIG. 12 shows a buffer die included in the first HBM 720 and a buffer die included in the second HBM 730.

The GPU 710 may provide the command CMD_A for arithmetic processing, data, and a weight to the first HBM 720. Under the control of a control logic 721 of the first HBM 720, arithmetic processing using the data and the weight may be performed in a core die of the first HBM 720. The buffer die of the first HBM 720 may receive the arithmetic result Data_Ari from the core die.

The control logic 721 may include a command/address generator C/A Gen or 721_1 for controlling a data write/read operation of the second HBM 730. The command/address generator 721_1 may generate the write command CMD_W for instructing the second HBM 730 to store the arithmetic result Data_Ari and the address ADD indicating a position at which the arithmetic result Data_Ari is to be stored. The control logic 721 may control an I/F circuit 721_2 to transmit the arithmetic result Data_Ari, the write command CMD_W, and the address ADD, which have been generated in the first HBM 720, to the second HBM 730.

Figure 13:
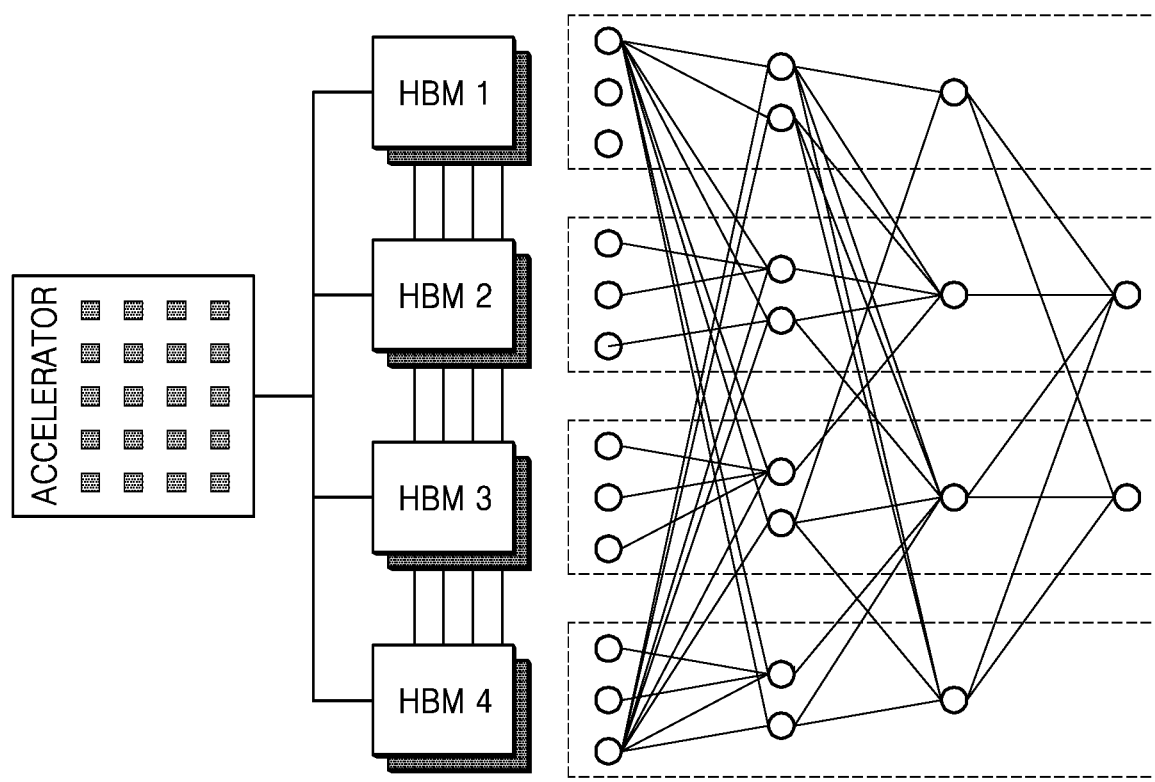
FIG. 13 is a diagram of an example in which a data processing system including an HBM according to an example embodiment of the inventive concept performs neural network computation.

FIG. 13 is a diagram of an example in which a data processing system including an HBM according to an example embodiment of the inventive concept performs neural network computation. FIG. 13 illustrates an example of neural network computation using one accelerator and a plurality of (for example, four) HBMs 1 through 4.

Neural network computation may be performed according to various models, e.g., a convolutional neural network (CNN), an RNN, a deep belief network, and a restricted Boltzman machine. For example, neural network computation may be performed in nodes in FIG. 13. An arithmetic result of each node may be provided to at least one other node.

Nodes performing arithmetic processing may respectively correspond to core dies or channels of each of the HBMs 1 through 4. Arithmetic processing at each node may be performed by an arithmetic circuit included in a core die (or a channel). The nodes of FIG. 13 may form layers involved in neural network computation. For example, the nodes of FIG. 13 may form an input layer, at least one hidden layer, and an output layer.

Referring to FIG. 13, under the control of an HW accelerator, at least a portion of neural network computation may be performed in the HBMs 1 through 4. For example, each of the HBMs 1 through 4 may include a plurality of core dies, each of the core dies may include at least one channel, and at least a portion of the neural network computation may be performed in the channels of the HBMs 1 through 4 in a distributed fashion. The HW accelerator may perform another portion of the neural network computation.

The HBMs 1 through 4 may interface with one another in various types of connection architecture. For example, when the HBMs 1 through 4 have fully connected architecture, each of the HBMs 1 through 4 may communicate with the other ones of the HBMs 1 through 4. When HBMs 1 through 4 have partially connected architecture, each of the HBMs 1 through 4 may communicate with some of the other HBMs. For example, an arithmetic result with respect to a portion of neural network computation may be provided from one HBM to at least one other HBMs and an arithmetic result with respect to another portion of the neural network computation may be provided to another core die or channel in one HBM without being provided to another HBM.

Figure 14:
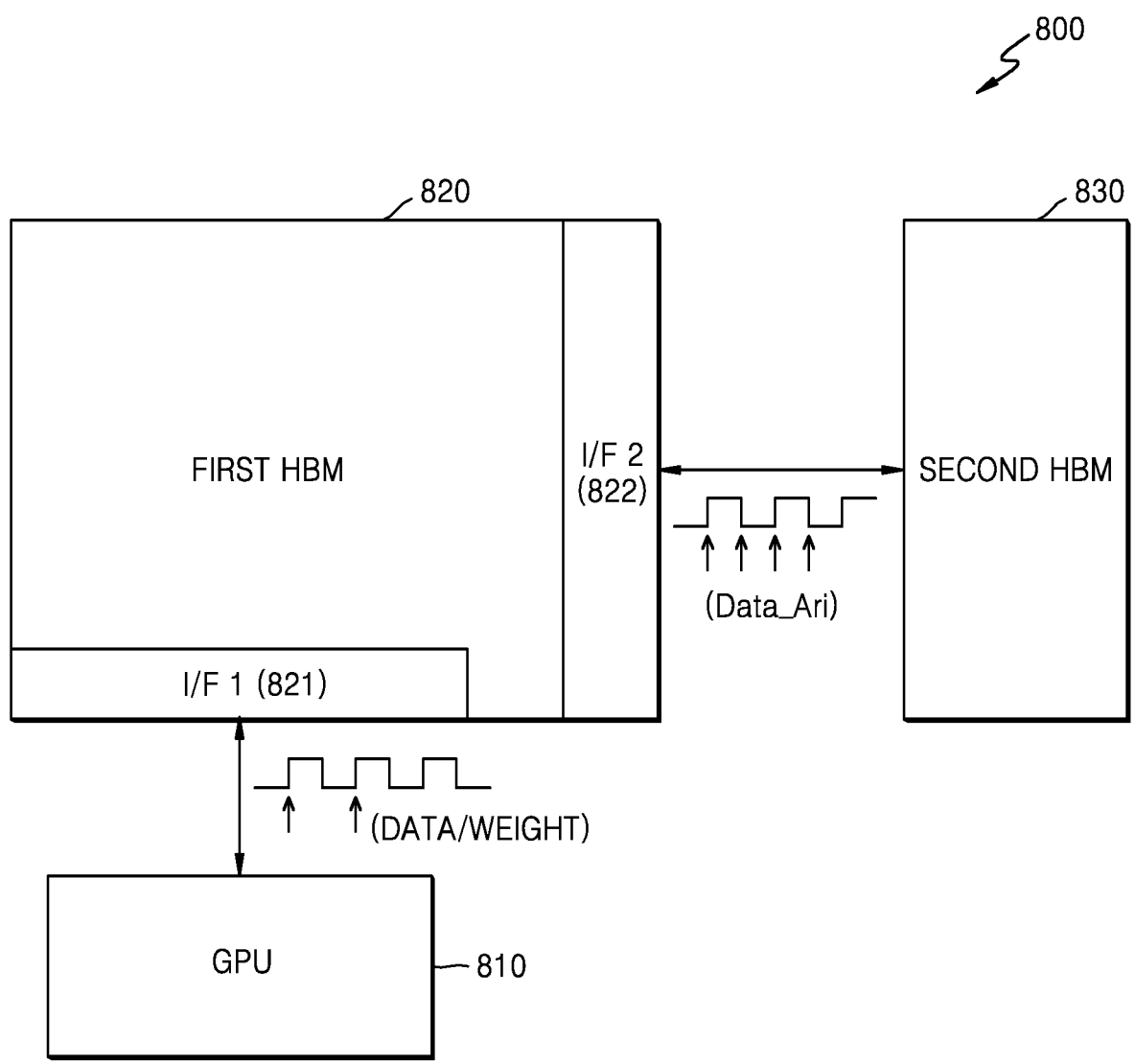
FIG. 14 is a block diagram of an example of signal transmission in a multi-port included in an HBM.

FIG. 14 is a block diagram of an example of signal transmission in multi-port included in an HBM.

Referring to FIG. 14, a data processing system 800 may include a GPU 810 as an HW accelerator and a plurality of first and second HBMs 820 and 830. For example, the first HBM 820 may include a first I/F circuit 821 and a second I/F circuit 822 and may communicate with the GPU 810 through the first I/F circuit 821 and with the second HBM 830 through the second I/F circuit 822. The first HBM 820 may perform arithmetic processing on data and a weight, which have been received through the first I/F circuit 821, and may transmit the arithmetic result Data_Ari to the second HBM 830 through the second I/F circuit 822. In an embodiment, the first HBM 820 may sequentially perform a signal input operation with respect to the GPU 810 and sequentially perform a signal output operation with respect to the second HBM 830. The input and output operations of the first HBM 820 may be simultaneously performed.

The first HBM 820 may perform communication of data, a weight, and the arithmetic result Data_Ari through a plurality of pins formed on an outer surface thereof. At this time, the first HBM 820 may output the arithmetic result Data_Ari through some data pins among all of the pins. In this case, a data transmission bandwidth may be reduced.

According to an embodiment of the inventive concept, a transmission mode for transmitting the arithmetic result Data_Ari through the second I/F circuit 822 may be configured differently from a transmission mode for the first I/F circuit 821 to increase the transmission speed of the arithmetic result Data_Ari. For example, a clock signal may be provided to the second HBM 830 through the second I/F circuit 822 together with the arithmetic result Data_Ari. At this time, the arithmetic result Data_Ari may be provided to the second HBM 830 in synchronization with a rising edge and a falling edge of the clock signal. In other words, the arithmetic result Data_Ari may be provided to the second HBM 830 in a DDR mode. Contrarily, the first I/F circuit 821 may receive data and a weight in response to a rising edge of a clock signal.

In the embodiment described above, even when an HBM includes multiple ports and the arithmetic result Data_Ari is communicated using one of the multiple ports, the transmission speed of the arithmetic result Data_Ari may be increased through the configuration of a data transmission mode, as described above.

Figure 15:
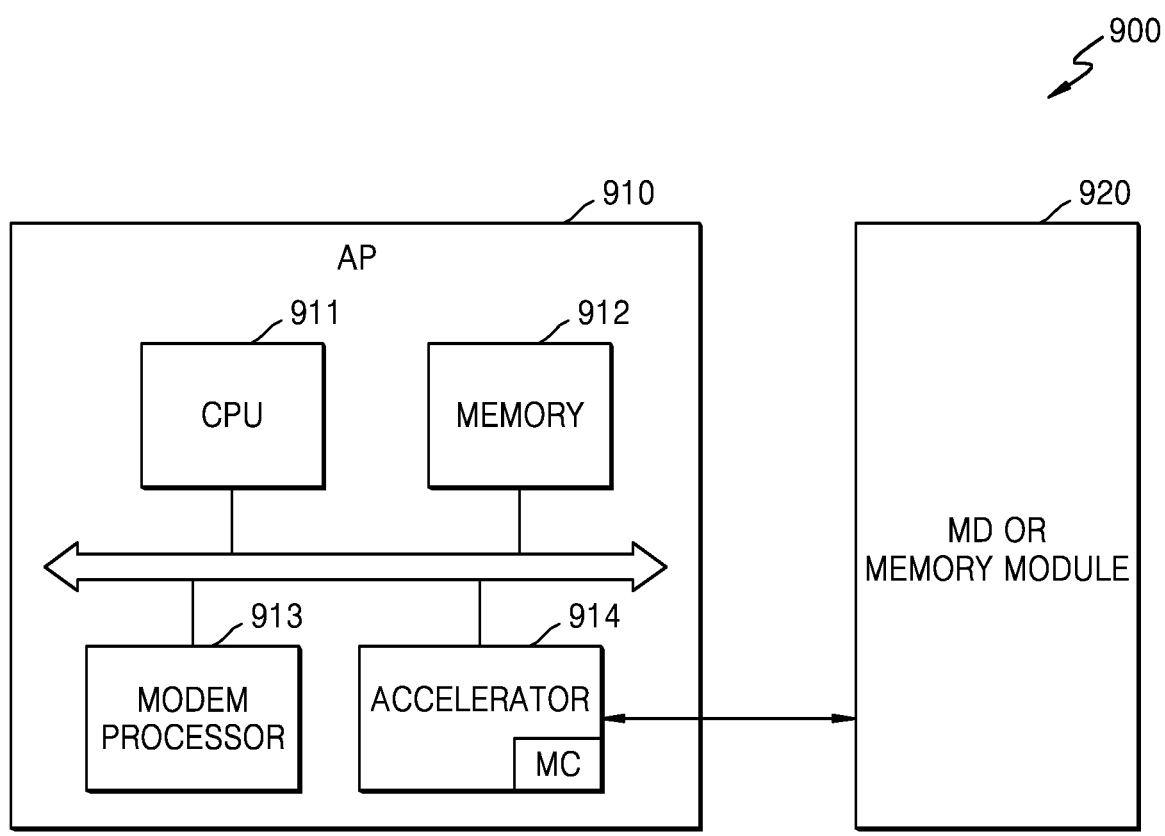
FIG. 15 is a block diagram of an exemplary implementation of a mobile device including a memory device, according to an example embodiment of the inventive concept.

FIG. 15 is a block diagram of an exemplary implementation of a mobile device including an MD, according to an example embodiment of the inventive concept.

A mobile device 900 may correspond to a data processing system and may include an application processor (AP) 910 and an MD 920. The AP 910 may be implemented as a system-on-chip (SoC). The SoC may include a system bus (not shown) complying with a standard bus protocol and may include various IPs connected to the system bus. The standard bus protocol may be an advanced microcontroller bus architecture (AMBA) protocol of Advanced RISC Machine (ARM) Limited. The AMBA protocol may include bus types such as advanced high-performance bus (AHB), advanced peripheral bus (APB), advanced extensible interface (AXI), AXI4, and AXI coherency extensions (ACE).

Besides, other types of protocols such as uNetwork of SONICs Inc., CoreConnect of IBM, and open core protocol of OCP-IP's may be used.

The AP 910 may include a CPU 911 and an HW accelerator 914, which have been described above. The HW accelerator 914 may include a memory controller MC. Although one HW accelerator 914 is illustrated in FIG. 15, the AP 910 may include various kinds of at least two HW accelerators. The AP 910 may also include a memory 912 storing commands for controlling all operations of the mobile device 900. The AP 910 may also include a modem processor 913 as a component for controlling a modem communication function. At this time, the AP 910 may be referred to as ModAP.

The MD 920 may include a plurality of DRAM chips. For example, the MD 920 may include at least one memory module and each memory module may include a plurality of DRAM chips. The MD 920 may also include a plurality of HBMs. For example, the MD 920 may include at least one HBM module including a plurality of HBMs.

According to the embodiments described above, the HW accelerator 914 may control the MD 920, and the DRAM chips of the MD 920 may interface with each other for data communication. For example, one of the DRAM chips may perform arithmetic processing under the control of the HW accelerator 914 and an arithmetic result of one DRAM chip may be transmitted directly to another DRAM chip without passing through the HW accelerator 914.

In addition to the configuration shown in FIG. 15, the mobile device 900 may also include an additional HW accelerator provided outside the AP 910, and the MD 920 may be controlled by the additional HW accelerator.

Figure 16:
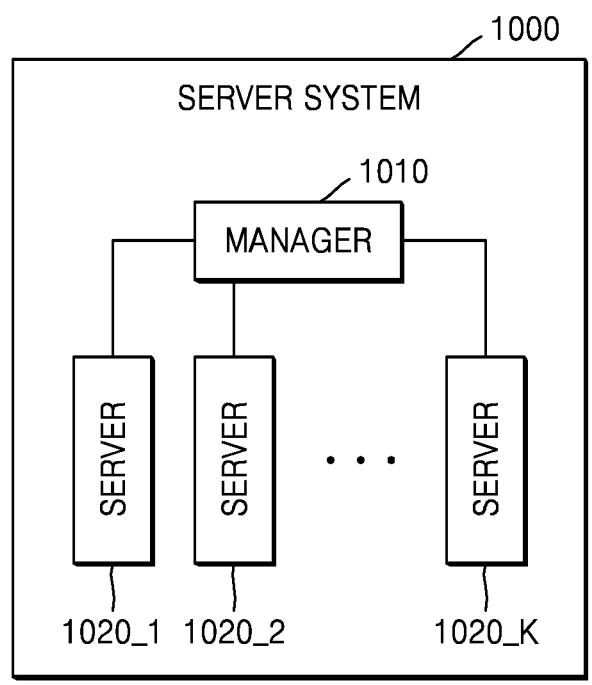
FIG. 16 is a block diagram of a server system including a data processing system, according to an example embodiment of the inventive concept.

FIG. 16 is a block diagram of a server system including a data processing system, according to an example embodiment of the inventive concept.

Referring to FIG. 16, a server system 1000 may include a manager 1010 and a plurality of servers 1020_1 through 1020_K. Each of the servers 1020_1 through 1020_K may correspond to any one of the data processing systems described with reference to FIGS. 1 through 15. The servers 1020_1 through 1020_K may be connected with one another through a bus supporting a predetermined protocol (e.g., PCI, PCIe, or the like). For example, the servers 1020_1 through 1020_K may communicate with one another through P2P connection architecture under the control of the manager 1010.

Referring to one (e.g., the server 1020_1) of the servers 1020_1 through 1020_K, the server 1020_1 may include a CPU, an HW accelerator, and a plurality of MDs according to the embodiments described above. The server 1020_1 may perform various kinds of arithmetic processing according to the functions thereof and may store the processing results. In an embodiment, the server system 1000 may correspond to a neural network server system and the server 1020_1 may perform neural network computation in the MDs under the control of the CPU and the HW accelerator. A neural network processing result may be produced based on arithmetic results of the MDs and may be provided to a client of the server system 1000.

While the inventive concept has been particularly shown and described with reference to embodiments thereof, it will be understood that various changes in form and details may be made therein without departing from the spirit and scope of the following claims.

What is claimed is:

1. A memory module comprising:
a first memory device configured to receive data and first information from a hardware accelerator, to generate an arithmetic result by performing arithmetic processing using the data and the first information, and to output the arithmetic result through an interface that communicates with at least one other memory device; and
a second memory device configured to receive the arithmetic result from the first memory device through the interface without using the hardware accelerator, and to store the arithmetic result,
wherein:
the first memory device comprises a first die configured to communicate with a device outside the first memory device, and a plurality of second dies,
each of the second dies comprises a memory cell array and an arithmetic circuit configured to perform the arithmetic processing, and
the first die comprises a first interface circuit configured to exchange the data with the hardware accelerator and a second interface circuit configured to exchange the arithmetic result with the second memory device.

2. The memory module of claim 1, wherein arithmetic processing using data received from the hardware accelerator is performed in parallel in the plurality of second dies in a distributed fashion.

3. The memory module of claim 1, wherein the hardware accelerator comprises at least one selected from a field-programmable gate array (FPGA), a massively parallel processor array (MPPA), a graphics processing unit (GPU), an application-specific integrated circuit (ASIC), a neural processing unit (NPU), a tensor processing unit (TPU), and a multi-processor system-on-chip (MPSoC).

4. The memory module of claim 1, wherein the first interface circuit receives the data in response to one of a rising edge and a falling edge of a clock signal, and
the second interface circuit outputs the arithmetic result in response to a rising edge and a falling edge of a clock signal.

5. The memory module of claim 1, wherein the first memory device comprises a first high bandwidth memory (HBM), the second memory device comprises a second HBM, the first die comprises a buffer die, and the second dies comprise core dies stacked on the buffer die.

6. The memory module of claim 1, wherein the first memory device receives a weight as the first information from the hardware accelerator for neural network computation and generates, as the arithmetic result, a neural network computation result obtained using the data and the weight.

7. The memory module of claim 1, wherein the second memory device receives a command and an address from the hardware accelerator and stores the arithmetic result received from the first memory device at a position indicated by the address.

8. The memory module of claim 1, wherein the first memory device comprises a command/address generator and transmits a command and an address to the second memory device, the command requesting to store the arithmetic result, and the address indicating a position at which the arithmetic result is to be stored, and
the second memory device stores the arithmetic result in response to the command and the address from the first memory device.

9. The memory module of claim 1, further comprising a third memory device configured to communicate with the second memory device, wherein the third memory device receives the arithmetic result from the second memory device and provides the arithmetic result to the hardware accelerator, under control of the hardware accelerator.

10. The memory module of claim 1, wherein the hardware accelerator is provided inside the memory module.

11. A memory module comprising:
an interposer having wiring for signal transmission formed thereon; and
a plurality of high bandwidth memories (HBMs) mounted on the interposer,
wherein each of the HBMs comprises a plurality of core dies, and a buffer die configured to communicate with a device outside each HBM, each of the core dies comprising a memory cell array and an arithmetic circuit configured to perform arithmetic processing,
a first HBM among the plurality of HBMs is configured to receive data from a memory controller through a buffer die and perform arithmetic processing using the data in a plurality of core dies in parallel, and
the memory module is configured such that an arithmetic result of the first HBM is provided to a second HBM among the plurality of HBMs through data communication between the buffer die of the first HBM and a buffer die of the second HBM.

12. The memory module of claim 11, wherein the memory controller is provided outside the memory module and comprises a hardware accelerator configured to control neural network computation.

13. The memory module of claim 12, wherein the first HBM is further configured to receive a plurality of weights from the hardware accelerator through the buffer die thereof, and each of the core dies of the first HBM is configured to perform the neural network computation using a respective piece of the data and a respective weight.

14. The memory module of claim 13, wherein the plurality of HBMs comprise HBMs arranged in A rows and B columns, where A and B are integers of at least 2,
the first HBM is in the same column as the second HBM,
B HBMs in one row are configured to respectively receive different weights from the memory controller in parallel,
the hardware accelerator is configured such that data from the hardware accelerator is transmitted to the B HBMs sequentially in one direction, and
each of the B HBMs is configured to perform the neural network computation using the data and a corresponding weight among the different weights.

15. The memory module of claim 14, wherein each of the different weights from the hardware accelerator is transmitted to A HBMs sequentially in one column.

16. The memory module of claim 11, wherein the buffer die of the first HBM comprises a converter and is configured to perform serial-parallel conversion on at least one among the data and an arithmetic result, the data being provided to the core dies, and the arithmetic result being received from the core dies.

17. A memory device comprising:
a first die configured to interface with an external memory controller and an external memory device;
a plurality of second dies stacked on the first die, each of the second dies comprising a memory cell array; and
a through-silicon via (TSV) region configured to transmit and receive a signal between the first die and the plurality of second dies,
wherein each of the second dies comprises a plurality of channels, each of the channels comprising an arithmetic circuit configured to perform arithmetic processing using data provided from the external memory controller, and
the first die comprises:
a first interface circuit configured to receive the data and an arithmetic command by communicating with the external memory controller and to transmit the received data to the second dies through the TSV region; and
a second interface circuit configured to receive an arithmetic result from the second dies through the TSV region and to output the arithmetic result by communicating with the external memory device.

18. The memory device of claim 17, wherein the memory device is a high bandwidth memory (HBM), the first die comprises a buffer die, and each of the second dies comprises a core die.

19. The memory device of claim 17, wherein the second interface circuit receives the arithmetic result from the external memory device, and
the arithmetic circuit is configured to perform the arithmetic processing using information provided from the external memory controller and the arithmetic result received through the second interface circuit.

* * * * *